United States Patent
Sawatari et al.

(10) Patent No.: US 8,964,407 B2
(45) Date of Patent: Feb. 24, 2015

(54) SUBSTRATE WITH BUILT-IN ELECTRONIC COMPONENT

(71) Applicant: Taiyo Yuden Co., Ltd., Tokyo (JP)

(72) Inventors: Tatsuro Sawatari, Tokyo (JP); Yuichi Sugiyama, Tokyo (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 0 days.

(21) Appl. No.: 14/101,054

(22) Filed: Dec. 9, 2013

(65) Prior Publication Data

US 2014/0285988 A1    Sep. 25, 2014

(30) Foreign Application Priority Data

Mar. 19, 2013  (JP) ................. 2013-056590
Sep. 25, 2013  (JP) ................. 2013-197663

(51) Int. Cl.
*H05K 7/02*    (2006.01)
*H05K 1/18*    (2006.01)

(52) U.S. Cl.
CPC .................... *H05K 1/185* (2013.01)
USPC ............ 361/811; 361/761; 361/760; 361/748

(58) Field of Classification Search
CPC ........ H05K 7/02; H01F 27/027; H01L 25/03; H01I 2924/01078
USPC .................................. 361/811, 761
See application file for complete search history.

(56) References Cited

U.S. PATENT DOCUMENTS

2006/0098396 A1    5/2006  Shih
2013/0194764 A1*   8/2013  Mikado et al. ................ 361/761

FOREIGN PATENT DOCUMENTS

JP    2006-129448 A    5/2006
JP    2009-081183 A    4/2009
JP    2013-021269 A    1/2013

OTHER PUBLICATIONS

Office Action issued in counterpart Japanese Application No. 2013-197663 dated Jan. 6, 2014 and English translation of the same (7 pages).

* cited by examiner

*Primary Examiner* — Andargie M Aychillhum
(74) *Attorney, Agent, or Firm* — Fitch Even Tabin & Flannery, LLP

(57) ABSTRACT

A substrate with built-in electronic component includes: a core layer that includes a core material and a cavity formed in the core material and containing an insulating material; an insulating layer that includes a ground wiring and a signal wiring and is formed on the core layer; and a plurality of electronic components that each include a first terminal and a second terminal and are stored in the cavity, the plurality of electronic components each having one end portion and the other end portion, the first terminal being formed at the one end portion and connected to the ground wiring, the second terminal being formed at the other end portion and connected to the signal wiring, the plurality of electronic components having at least one of arrangements in which the first terminals face each other and in which the second terminals face each other.

6 Claims, 8 Drawing Sheets

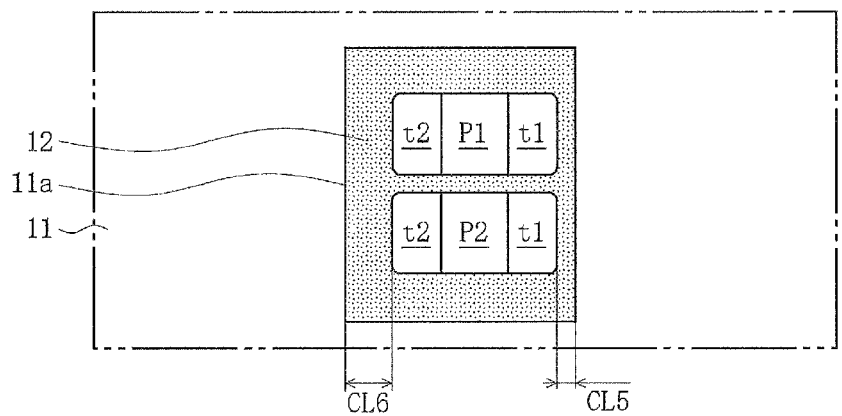
FIG.7
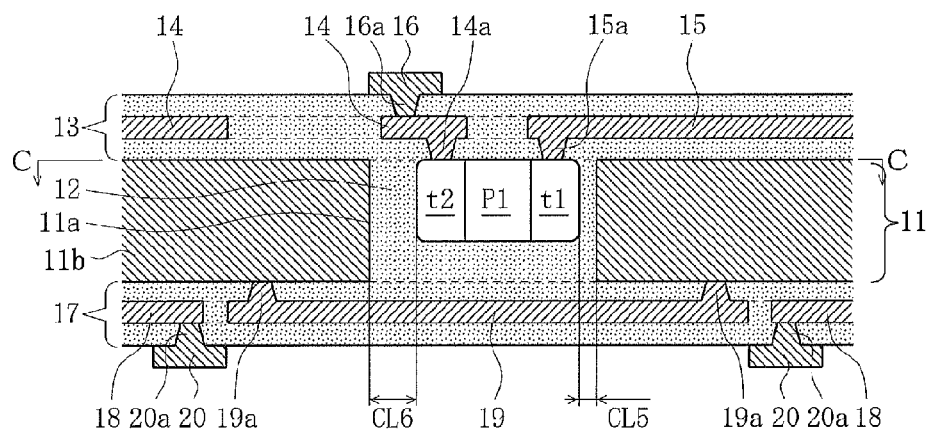
FIG.8
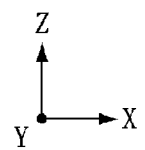

SUBSTRATE WITH BUILT-IN ELECTRONIC COMPONENT

CROSS-REFERENCE TO RELATED APPLICATIONS

This application claims priority under 35 U.S.C. §119 to Japanese Patent Application No. JP2013-197663, filed on Sep. 25, 2013, and Japanese Application No. 2013-056590, filed on Mar. 19, 2013, the entire content of which are hereby incorporated herein by reference in their entirety.

FIELD

The present disclosure relates to a substrate with built-in electronic component, in which an electronic component is stored in a cavity of a core layer, and more particularly, to a substrate with built-in electronic component, in which a plurality of electronic components are stored in one cavity.

BACKGROUND

A substrate with built-in electronic component, in which electronic components are stored in a cavity of a core layer, includes a core layer including a core material and a cavity formed by penetrating the core material, electronic components stored in the cavity, an insulating material that fills a gap between the cavity and each electronic component, and an insulating layer formed on the core layer and including a ground wiring, a signal wiring, and the like. The substrate with built-in electronic component has a structure in which the electronic components stored in the cavity are connected to those wirings.

In a major substrate with built-in electronic component in related art, one electronic component is stored in one cavity. In recent years, an attempt to store a plurality of electronic components in one cavity has been made for the purpose of reducing the number of electronic components to be mounted on a surface of the substrate with built-in electronic component.

For example, Japanese Patent Application Laid-open No. 2009-081183 discloses that a capacitor unit in which external electrodes of a plurality of capacitors are connected to be integrated is stored in a cavity of a core substrate. In this technique, the capacitor unit should be preliminarily manufactured before the external electrodes are stored, which is burdensome. In addition, when the arrangement of the capacitor unit in the cavity is changed, the arrangement of all the capacitors that constitute the capacitor unit is changed accordingly. Consequently, the degree of freedom in arrangement (degree of freedom in position or orientation) is lower compared with the case where the capacitors are individually stored. In contrast, Japanese Patent Application Laid-open No. 2006-129448 discloses that a plurality of active components, passive components, or active and passive components are stored in a concave portion of a support. In this technique, the positions or orientations of the stored components are not taken into consideration, and thus there may be a possibility that mutual interference such as crosstalk is caused between the adjacent components.

SUMMARY

In view of the circumstances described above, it is desirable to provide a substrate with built-in electronic component, which is capable of obtaining a high degree of freedom in arrangement of electronic components in a cavity and of suppressing mutual interference between the electronic components stored in the cavity, also when a plurality of electronic components are stored in one cavity.

According to an embodiment of the present disclosure, there is provided a substrate with built-in electronic component, including a core layer, an insulating layer, and a plurality of electronic components.

The core layer includes a core material and a cavity formed in the core material and containing an insulating material.

The insulating layer includes a ground wiring and a signal wiring and is formed on the core layer.

The plurality of electronic components each include a first terminal and a second terminal and are stored in the cavity, the plurality of electronic components each having one end portion and the other end portion, the first terminal being formed at the one end portion and connected to the ground wiring, the second terminal being formed at the other end portion and connected to the signal wiring. Further, the plurality of electronic components have at least one of arrangements in which the first terminals face each other and in which the second terminals face each other.

Further, according to another embodiment of the present disclosure, there is provided a substrate with built-in electronic component, the substrate including a core layer including a cavity, electronic components stored in the cavity, an insulating material that fills a gap between the cavity and each of the electronic components, an insulating layer provided on a surface of the core layer in at least a thickness direction, and a wiring provided in the insulating layer, the substrate having a structure in which the electronic components stored in the cavity are connected to the wiring. The electronic components each have end portions on opposite sides and include a first terminal and a second terminal, the first terminal being formed at one of the end portions and used as a terminal on a ground potential side, the second terminal being formed at the other end portion and used as a terminal on a signal potential side. Two or more electronic components are stored in the one cavity, and the two or more electronic components stored in the one cavity have at least one of arrangements in which the first terminals on the ground potential side face each other in a non-contact manner and in which the second terminals on the signal potential side face each other in a non-contact manner.

According to the present disclosure, it is possible to provide a substrate with built-in electronic component, which is capable of obtaining a high degree of freedom in arrangement of electronic components in a cavity and of suppressing mutual interference between the electronic components stored in the cavity, also when a plurality of electronic components are stored in one cavity.

These and other objects, features and advantages of the present disclosure will become more apparent in light of the following detailed description of best mode embodiments thereof, as illustrated in the accompanying drawings.

BRIEF DESCRIPTION OF THE DRAWINGS

FIG. 7 is a horizontal cross-sectional view showing an arrangement of electronic components in a substrate with built-in electronic component according to a third embodiment of the present disclosure;

FIG. 8 is a vertical cross-sectional view showing a structure example of the substrate with built-in electronic component that has the arrangement shown in FIG. 7;

DETAILED DESCRIPTION OF EMBODIMENTS

Figure 1:
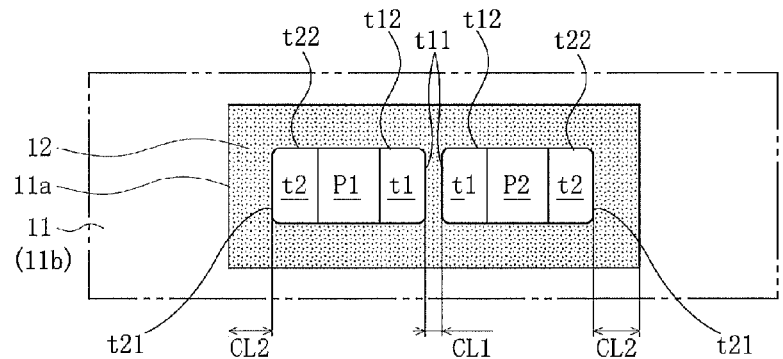
FIG. 1 is a horizontal cross-sectional view showing an arrangement of electronic components in a substrate with built-in electronic component according to a first embodiment of the present disclosure.
Figure 1:
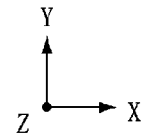

According to an embodiment of the present disclosure, there is provided a substrate with built-in electronic component, the substrate including a core layer, an insulating layer, and a plurality of electronic components.

The core layer includes a core material and a cavity formed in the core material and containing an insulating material.

The insulating layer includes a ground wiring and a signal wiring and is formed on the core layer.

The plurality of electronic components each include a first terminal and a second terminal and are stored in the cavity, the plurality of electronic components each having one end portion and the other end portion, the first terminal being formed at the one end portion and connected to the ground wiring, the second terminal being formed at the other end portion and connected to the signal wiring. Further, the plurality of electronic components have at least one of arrangements in which the first terminals face each other and in which the second terminals face each other.

With the substrate with built-in electronic component, the plurality of electronic components are arranged in the cavity, and thus the degree of freedom in arrangement of the plurality of electronic components can be increased. Further, the plurality of electronic components are arranged such that the same type of terminals face each other, and thus mutual interference, such as crosstalk, between the electronic components can be suppressed compared with the arrangement in which the first terminal on the ground potential side and the second terminal on the signal potential side face each other.

The plurality of electronic components may be arranged such that the first terminals face each other via the insulating material and each of the second terminals and the core material face each other via the insulating material.

With this structure, the first terminals on the ground potential side face each other, and thus a distance between the first terminals of the plurality of electronic components can be reduced. Consequently, the length of the cavity in a direction in which those electronic components face each other can be reduced, and a reduction in area of the horizontal cross-section of the cavity can be achieved, resulting in a contribution to the downsizing of the substrate with built-in electronic component. Further, each of the second terminals and the core material face each other via the insulating material, and thus an electromagnetic failure caused between them can be prevented.

In this case, the core material may be made of a conductor and may be kept at a ground potential, and each of the second terminals and the core material may face each other at a distance larger than that between the first terminals. With this structure, if the positions of the electronic components are somewhat displaced in a process of manufacturing the substrate with built-in electronic component, the second terminals on the signal potential side and the core material that is kept at a ground potential can be prevented from coming into contact with each other. Consequently, an electromagnetic failure between them can be prevented, and defects or the like of the electronic components can be prevented. Further, the distance between the first terminals can be reduced relatively, and thus the downsizing of the substrate with built-in electronic component can be achieved while preventing an electromagnetic failure.

Alternatively, the plurality of electronic components may be arranged such that the second terminals face each other via the insulating material and each of the first terminals and the core material face each other via the insulating material. With this structure, the second terminals on the signal potential side face each other, and thus mutual interference, such as crosstalk, between the electronic components can be suppressed compared with the arrangement in which the first terminal on the ground potential side and the second terminal on the signal potential side face each other.

In this case, the core material may be made of a conductor and may be kept at a ground potential, and the second terminals face each other at a distance larger than that between each of the first terminals and the core material.

With this structure, if the positions of the electronic components are somewhat displaced in a process of manufacturing the substrate with built-in electronic component, the second terminals on the signal potential side can be prevented from being coming into contact with each other. Consequently, an electromagnetic failure between them can be prevented, and defects or the like of the electronic components can be prevented. Further, the distance between each of the first terminals on the ground potential side and the core material that is kept at a ground potential can be reduced relatively, and thus the downsizing of the substrate with built-in electronic component can be achieved while preventing an electromagnetic failure.

Further, the first terminal and the second terminal may each have an end surface and a side surface connected to the end surface, the plurality of electronic components may be arranged such that the side surfaces of the first terminals face each other via the insulating material and the side surfaces of the second terminals face each other via the insulating material, and the second terminals whose side surfaces face each other may be connected to each other.

With this structure, the plurality of electronic components can be arranged to be adjacent to one another when arranged to be parallel. This allows a reduction in area of the horizontal cross-section of the cavity to be achieved, resulting in a contribution to the downsizing of the substrate with built-in electronic component.

In this case, the core material may be made of a conductor and may be kept at a ground potential, the plurality of electronic components may be arranged such that the end surfaces of the first terminals each face the core material and the end surfaces of the second terminals each face the core material, and each of the second terminals and the core material may face each other at a distance larger than that between each of the first terminals and the core material. With this structure, if the positions of the electronic components are somewhat displaced in a process of manufacturing the substrate with built-in electronic component, the second terminals on the signal potential side and the core material that is kept at a ground potential can be prevented from coming into contact with each other. Consequently, an electromagnetic failure between them can be prevented, and defects or the like of the electronic components can be prevented. Further, the distance between the first terminals can be reduced relatively, and thus the downsizing of the substrate with built-in electronic component can be achieved while preventing an electromagnetic failure.

Alternatively, the plurality of electronic components may include a plurality of sets of electronic components in which the second terminals are connected to each other, and the plurality of sets of electronic components face each other via the end surfaces of the first terminals of the plurality of electronic components included in each of the sets of electronic components. With this structure, the sets of the plurality of electronic components connected parallel can face each other via the first terminals on the ground potential side and can be arranged close to each other. Consequently, also when a large number of electronic components are arranged in one cavity, a reduction in area of the horizontal cross-section of the cavity can be achieved, resulting in a contribution to the downsizing of the substrate with built-in electronic component.

Further, two of the plurality of electronic components may be arranged to face each other in one axis direction, and each of the two electronic components may be arranged such that the first terminal and the second terminal are arranged on a straight line along the axis direction. With this structure, the length of the cavity in one axis direction can be reduced. Consequently, a reduction in area of the horizontal cross-section of the cavity can be achieved, resulting in a contribution to the downsizing of the substrate with built-in electronic component.

Two of the plurality of electronic components may be arranged to face each other in one axis direction, and each of the two electronic components may be arranged such that the first terminal and the second terminal are arranged on a straight line along a direction orthogonal to the axis direction. With this structure, the plurality of electronic components can be arranged such that the side surfaces of the first terminals face each other in the axis direction and the side surfaces of the second terminals face each other in the axis direction. Consequently, the length of the cavity in a direction orthogonal to the axis direction can be reduced, and a reduction in area of the horizontal cross-section of the cavity can be achieved, resulting in a contribution to the downsizing of the substrate with built-in electronic component.

One of the plurality of electronic components may be arranged such that the first terminal and the second terminal are arranged on a straight line along one axis direction, and another one of the plurality of electronic components may be arranged such that the first terminal and the second terminal are arranged on a straight line along a direction orthogonal to the axis direction. With this structure, the shape of the cavity can be set according to the outline that surrounds the plurality of electronic components. This allows a further reduction in area of the horizontal cross-section of the cavity to be achieved, resulting in a further contribution to the downsizing of the substrate with built-in electronic component.

Hereinafter, embodiments of the present disclosure will be described with reference to the drawings.

First Embodiment

Figure 2:
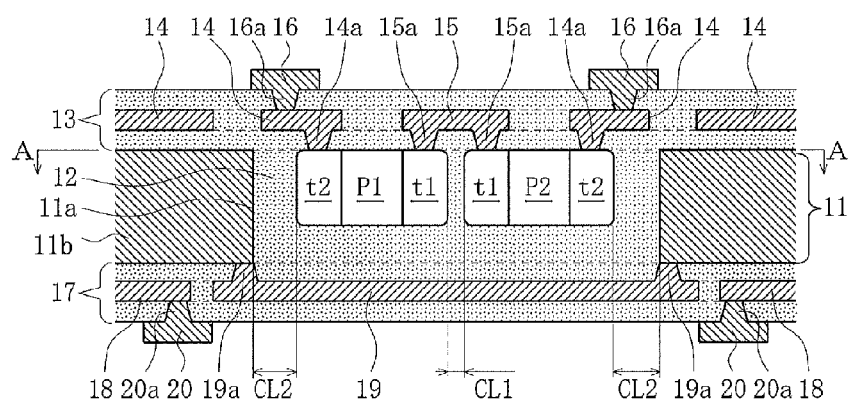
FIG. 2 is a vertical cross-sectional view showing a structure example of the substrate with built-in electronic component that has the arrangement shown in FIG. 1.
Figure 2:
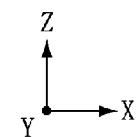
Figure 3:
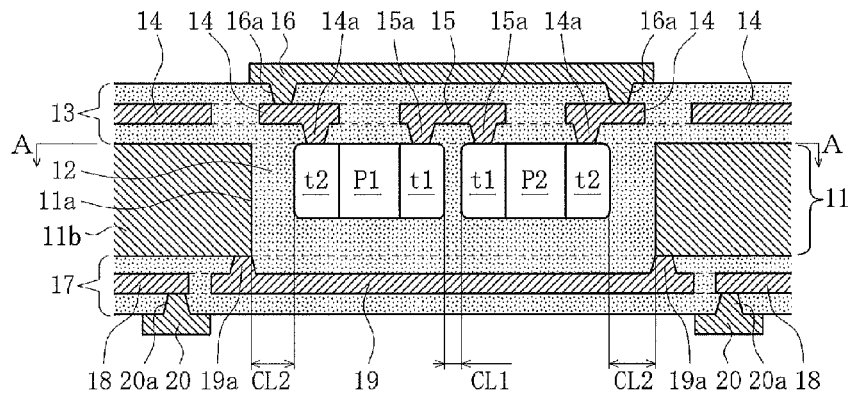
FIG. 3 is a vertical cross-sectional view showing another structure example of the substrate with built-in electronic component that has the arrangement shown in FIG. 1.

FIGS. 1 to 3

FIG. 1 is a horizontal cross-sectional view showing an arrangement of electronic components in a substrate with built-in electronic component according to a first embodiment of the present disclosure. FIG. 2 is a vertical cross-sectional view showing a structure example of the substrate with built-in electronic component that has the arrangement shown in FIG. 1. FIG. 3 is a vertical cross-sectional view showing another structure example of the substrate with built-in electronic component that has the arrangement shown in FIG. 1. It should be noted that FIG. 1 corresponds to a cross-sectional view taken along the line A-A of FIGS. 2 and 3. Further, an X-axis direction, a Y-axis direction, and a Z-axis direction in FIGS. 1 to 16 indicate three axis directions orthogonal to one another. Each of the X-axis direction and the Y-axis direction indicates a horizontal direction, and the Z-axis direction indicates a thickness direction (vertical direction).

As shown in FIGS. 1 to 3, the substrate with built-in electronic component in this embodiment includes a core layer 11 including a core material 11b and a cavity 11a, insulating layers 13 and 17 formed on the core layer 11, and two electronic components P1 and P2 stored in the cavity 11a.

The insulating layer 13 includes signal wirings 14 and a ground wiring 15 and is provided on the upper surface of the core layer 11. The signal wirings 14 and the ground wiring 15 are each formed in one wiring layer arranged in the insulating layer 13. Conductor pads 16 connected to the signal wirings 14 are provided on the upper surface of the insulating layer 13.

As in the insulating layer 13, the insulating layer 17 includes signal wirings 18 and a ground wiring 19 and is provided on the lower surface of the core layer 11. The signal wirings 18 and the ground wiring 19 are each formed in one wiring layer arranged in the insulating layer 17. Conductor pads 20 connected to the signal wirings 18 are provided on the lower surface of the insulating layer 17.

The insulating layers 13 and 17 each have the thickness of 30 to 90 µm, for example. Further, each of the signal wirings 14 and 18, ground wirings 15 and 19, and conductor pads 16 and 20 is made of metal such as copper and an copper alloy and has the thickness of 5 to 25 µm, for example.

The core material 11b is made of a conductor such as copper and a copper alloy and has the thickness of 100 to 400 µm, for example. The core material 11b is connected to the ground wiring 19 and is kept at a ground potential. The cavity 11a has a horizontal cross section with an approximately rectangular shape and is formed by penetrating the core material 11b in the Z-axis direction (thickness direction). The cavity 11a contains an insulating material 12 that fills a gap between the inner side surface of the core material 11b and each of the electronic components P1 and P2. The insulating material 12 and the insulating layers 13 and 17 are each made of a synthetic resin of an epoxy resin, polyimide, a bismaleimide triazine resin, a resin containing any one of them and a reinforcing filler made of a silicon dioxide, or the like (not only a thermosetting resin but also a thermoplastic resin can be used).

Each of the electronic components P1 and P2 has an approximately rectangular parallelepiped shape and is configured such that one end portion and the other end portion of the electronic component are arranged on a straight line extending along the X-axis direction in this embodiment. Each of the electronic components P1 and P2 includes a first terminal t1 and a second terminal t2. The first terminal t1 is formed at the one end portion and connected to the ground wiring 15. The second terminal t2 is formed at the other end portion and connected to the signal wiring 14. That is, the first terminal t1 is used as a terminal on a ground potential side and the second terminal t2 is used as a terminal on a signal potential side. Each of the electronic components P1 and P2 is an electronic component such as a capacitor, an inductor, a resistor, and a filter and may be a combination of the same kind of electronic components or a combination of different kinds of electronic components.

As shown in FIG. 1, the first terminal t1 has an end surface t11 and a side surface t12. The end surface t11 can be assumed to be an end surface at one end portion of each of the electronic components P1 and P2, and the side surface t12 can be assumed to be a surface that is connected to and substantially orthogonal to the end surface t11. Similarly, the second terminal t2 also has an end surface t21 and a side surface t22. The end surface t21 can be assumed to be an end surface at the other end portion of each of the electronic components P1 and P2, and the side surface t22 can be assumed to be a surface that is connected to and substantially orthogonal to the end surface t21.

As shown in FIG. 1, the two electronic components P1 and P2 are arranged such that their first terminals t1 face each other in the X-axis direction (one axis direction) and the first terminal t1 and the second terminal t2 of each electronic component are arranged on a straight line along the X-axis direction. That is, the end surfaces t11 of the first terminals t1 face each other at a distance CL1 via the insulating material 12. Further, the end surface t21 of each of the second terminals t2 faces the core material 11b (to the inner wall of the cavity 11a) at a distance CL2 larger than the distance CL1 via the insulating material 12. Furthermore, each of the side surfaces t12 and t22 of the first terminals t1 and the second terminals t2 faces the core material 11b (to the inner wall of the cavity 11a) at a distance (not denoted by a reference symbol) larger than the distance CL1 via the insulating material 12. It should be noted that in the following description, the phrase of "face the core material 11b" refers to "face the inner side surface of the core material 11b".

In the structure example shown in FIG. 2, the first terminals t1 of the electronic components P1 and P2 are connected to the common ground wiring 15 via conductor vias 15a. Further, the second terminal t2 of the electronic component P1 is connected to the signal wiring 14 (on the left-hand side of FIG. 2) via a conductor via 14a, and the second terminal t2 of the electronic component P2 is connected to the different signal wiring 14 (on the right-hand side of FIG. 2) via a conductor via 14a. Each of the signal wirings 14 is connected to a corresponding conductor pad 16 via a conductor via 16a.

In other words, in the structure example shown in FIG. 2, the first terminals t1 of the two electronic components P1 and P2 are each kept at a ground potential (for example, 0 V). In contrast, the second terminals t2 of the two electronic components P1 and P2 are each configured to receive an input of a signal individually from a corresponding conductor pad 16. Specifically, signals with different potentials (for example, +3 V, +5 V, or −3 V) or signals with the same potential (for example, +3 V, +5 V, or −3 V) can be input to the second terminals t2 of the electronic components P1 and P2. Herein, the signals may be analog or digital.

As another structure example, as shown in FIG. 3, the first terminals t1 of the electronic components P1 and P2 are connected to the common ground wiring 15 via the conductor vias 15a. Further, the second terminal t2 of the electronic component P1 is connected to the signal wiring 14 (on the left-hand side of FIG. 3) via the conductor via 14a, and the second terminal t2 of the electronic component P2 is connected to the different signal wiring 14 (on the right-hand side of FIG. 3) via the conductor via 14a. Additionally, the signal wirings 14 are connected to a common conductor pad 16 via the conductor vias 16a.

In other words, in the structure example shown in FIG. 3, the first terminals t1 of the two electronic components P1 and P2 on the ground potential side are each at a ground potential (for example, 0 V), and the second terminals t2 of the two electronic components P1 and P2 are each configured to receive an input of a signal from the common conductor pad 16. Specifically, signals with the same potential (for example, +3 V, +5 V, or −3 V) can be input to the second terminals t2 of the electronic components P1 and P2. Herein, the signals may be analog or digital.

According to the substrate with built-in electronic component in this embodiment, the following effects can be obtained.

(a1) One cavity 11a stores the two electronic components P1 and P2, and thus the electronic components P1 and P2 in the cavity 11a can have a high degree of freedom in arrangement (degree of freedom in position or orientation). Additionally, the two electronic components P1 and P2 stored in the cavity 11a are arranged such that the first terminals t1 on the ground potential side face each other in a non-contact manner. Consequently, compared with the case where the first terminal t1 on the ground potential side and the second terminal t2 on the signal potential side are arranged so as to face each other, mutual interference, such as crosstalk, between the electronic components P1 and P2 can be suppressed.

(a2) The first terminals t1 of the two electronic components P1 and P2 on the ground potential side face each other, and thus the distance CL1 between the first terminals t1 can be reduced as much as possible and the length of the cavity 11a in the X-axis direction can be reduced. This allows a reduction in area of the horizontal cross-section of the cavity 11a to be achieved, resulting in a contribution to the downsizing of the substrate with built-in electronic component.

(a3) The second terminals t2 of the two electronic components P1 and P2 on the signal potential side each face the core material 11b (to the inner wall of the cavity 11a) at the distance CL2 larger than the distance CL1, or the like. This arrangement can avoid bringing the second terminals t2 of the electronic components P1 and P2 into contact with the core material 11b that is kept at a ground potential, if the positions of the electronic components P1 and P2 are somewhat displaced in a process of manufacturing the substrate with built-in electronic component. Consequently, an electromagnetic failure due to such a contact can be prevented, and defects or the like of the electronic components P1 and P2 can be prevented. Further, if the first terminals t1 that are each kept at the ground potential are brought into contact with or close to each other, an electromagnetic failure does not occur. This also allows the defects or the like of the electronic components P1 and P2 to be prevented.

(a4) The electronic components P1 and P2 are arranged such that a direction connecting the first terminals t1 and the second terminals t2 is on an approximately straight line along the X-axis direction, and thus the length of the cavity 11a in the Y-axis direction can be reduced. This allows a further reduction in area of the horizontal cross-section of the cavity 11a to be achieved, resulting in a further contribution to the downsizing of the substrate with built-in electronic component.

(a5) The structure example shown in FIG. 2 has a wiring structure in which the ground wiring 15 is interposed between the two signal wirings 14 connected to the second terminals t2 of the electronic components P1 and P2. Consequently, in this structure example, also when signals with different potentials or with the same potential are individually input to the respective second terminals t2, the generation of noise interference between the two signal wirings 14 can be suppressed.

Second Embodiment

Figure 4:
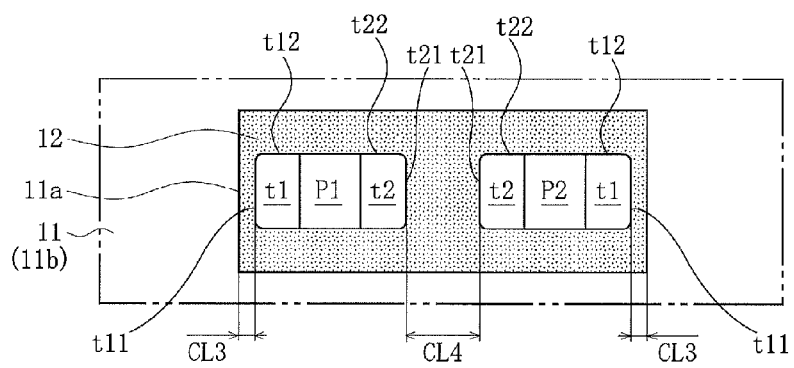
FIG. 4 is a horizontal cross-sectional view showing an arrangement of electronic components in a substrate with built-in electronic component according to a second embodiment of the present disclosure.
Figure 5:
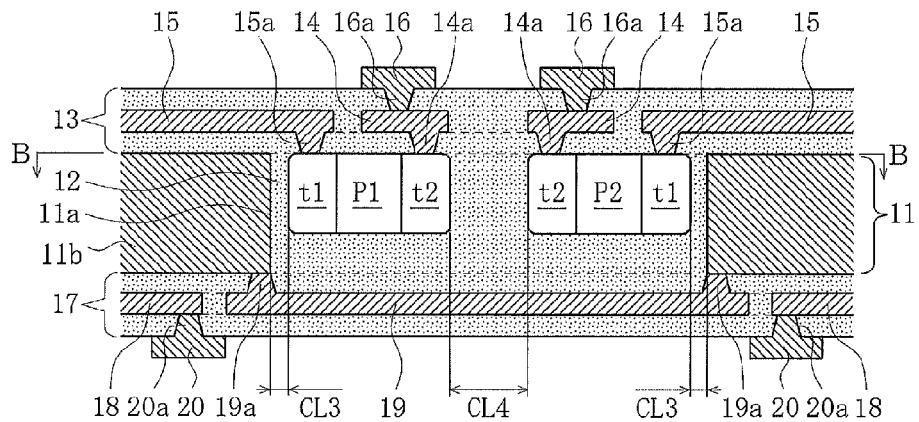
FIG. 5 is a vertical cross-sectional view showing a structure example of the substrate with built-in electronic component that has the arrangement shown in FIG. 4.
Figure 5:
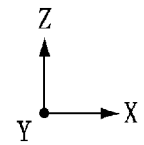
Figure 6:
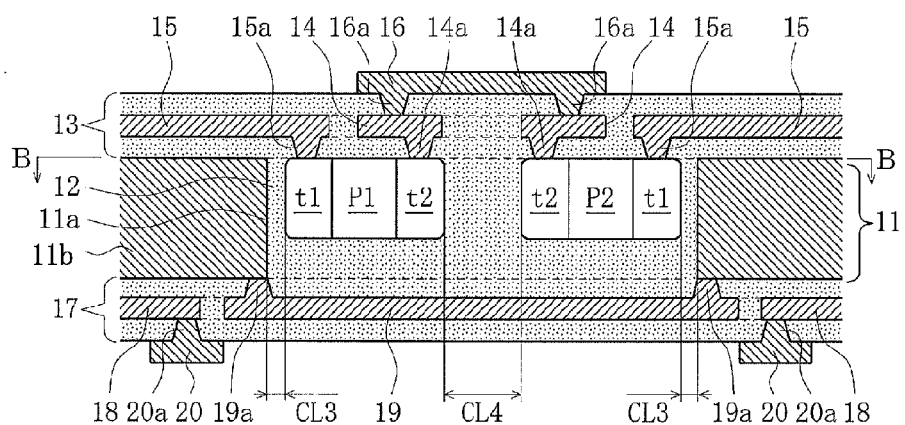
FIG. 6 is a vertical cross-sectional view showing another structure example of the substrate with built-in electronic component that has the arrangement shown in FIG. 4.
Figure 6:
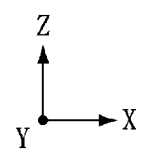

FIGS. 4 to 6

FIG. 4 is a horizontal cross-sectional view showing an arrangement of electronic components in a substrate with built-in electronic component according to a second embodiment of the present disclosure. FIG. 5 is a vertical cross-sectional view showing a structure example of the substrate with built-in electronic component that has the arrangement shown in FIG. 4. FIG. 6 is a vertical cross-sectional view showing another structure example of the substrate with built-in electronic component that has the arrangement shown in FIG. 4. It should be noted that FIG. 4 corresponds to a cross-sectional view taken along the line B-B of FIGS. 5 and 6.

As shown in FIGS. 4 to 6, the substrate with built-in electronic component in this embodiment includes a core layer 11 including a core material 11b and a cavity 11a, insulating layers 13 and 17 formed on the core layer 11, and two electronic components P1 and P2 stored in the cavity 11a.

The insulating layer 13 includes signal wirings 14 and ground wirings 15 and is provided on the upper surface of the core layer 11. The signal wirings 14 and the ground wirings 15 are each formed in one wiring layer arranged in the insulating layer 13. Conductor pads 16 connected to the signal wirings 14 are provided on the upper surface of the insulating layer 13.

As in the insulating layer 13, the insulating layer 17 includes signal wirings 18 and a ground wiring 19 and is provided on the lower surface of the core layer 11. The signal wirings 18 and the ground wiring 19 are each formed in one wiring layer arranged in the insulating layer 17. Conductor pads 20 connected to the signal wirings 18 are provided on the lower surface of the insulating layer 17.

The insulating layers 13 and 17 each have the thickness of 30 to 90 μm, for example. Further, each of the signal wirings 14 and 18, ground wirings 15 and 19, and conductor pads 16 and 20 is made of metal such as copper and an copper alloy and has the thickness of 5 to 25 μm, for example.

The core material 11b is made of a conductor such as copper and a copper alloy and has the thickness of 100 to 400 μm, for example. The core material 11b is connected to the ground wiring 19 and is kept at a ground potential. The cavity 11a has a horizontal cross section with an approximately rectangular shape and is formed by penetrating the core material 11b in the Z-axis direction (thickness direction). The cavity 11a contains an insulating material 12 that fills a gap between the inner side surface of the core material 11b and each of the electronic components P1 and P2. The insulating material 12 and the insulating layers 13 and 17 are each made of a synthetic resin of an epoxy resin, polyimide, a bismaleimide triazine resin, a resin containing any one of them and a reinforcing filler made of a silicon dioxide, or the like (not only a thermosetting resin but also a thermoplastic resin can be used).

Each of the electronic components P1 and P2 has an approximately rectangular parallelepiped shape and is configured such that one end portion and the other end portion of the electronic component are arranged on a straight line extending along the X-axis direction in this embodiment. Each of the electronic components P1 and P2 includes a first terminal t1 and a second terminal t2. The first terminal t1 is formed at the one end portion and connected to the ground wiring 15. The second terminal t2 is formed at the other end portion and connected to the signal wiring 14. That is, the first terminal t1 is used as a terminal on a ground potential side and the second terminal t2 is used as a terminal on a signal potential side. Each of the electronic components P1 and P2 is an electronic component such as a capacitor, an inductor, a resistor, and a filter and may be a combination of the same kind of electronic components or a combination of different kinds of electronic components.

As shown in FIG. 4, the first terminal t1 has an end surface t11 and a side surface t12. The end surface t11 can be assumed to be an end surface at one end portion of each of the electronic components P1 and P2, and the side surface t12 can be assumed to be a surface that is connected to and substantially orthogonal to the end surface t11. Similarly, the second terminal t2 also has an end surface t21 and a side surface t22. The end surface t21 can be assumed to be an end surface at the other end portion of each of the electronic components P1 and P2, and the side surface t22 can be assumed to be a surface that is connected to and substantially orthogonal to the end surface t21.

As shown in FIG. 4, the two electronic components P1 and P2 are arranged such that their second terminals t2 face each other in the X-axis direction (one axis direction) and the first terminal t1 and the second terminal t2 of each electronic component are arranged on a straight line along the X-axis direction. That is, the end surface t11 of each of the first terminals t1 faces the core material 11b (to the inner wall of the cavity 11a) at a distance CL3 via the insulating material 12. Further, the end surfaces t21 of the second terminals t2 face each other at a distance CL4 larger than the distance CL3 via the insulating material 12. Furthermore, each of the side surfaces t12 and t22 of the first terminals t1 and the second terminals t2 faces the core material 11b (to the inner wall of the cavity 11a) at a distance (not denoted by a reference symbol) larger than the distance CL3 via the insulating material 12.

In the structure example shown in FIG. 5, the first terminal t1 of the electronic component P1 is connected to the ground wiring 15 (on the left-hand side of FIG. 5) via a conductor via 15a, and the first terminal t1 of the electronic component P2 is connected to the different ground wiring 15 (on the right-hand side of FIG. 5) via a conductor via 15a. Further, the second terminal t2 of the electronic component P1 is connected to the signal wiring 14 (on the left-hand side of FIG. 5) via a conductor via 14a, and the second terminal t2 of the electronic component P2 is connected to the different signal wiring 14 (on the right-hand side of FIG. 5) via a conductor via 14a. Furthermore, each of the signal wirings 14 is connected to a corresponding conductor pad 16 via a conductor via 16a.

In other words, in the structure example shown in FIG. 5, the first terminals t1 of the two electronic components P1 and P2 are each kept at a ground potential (for example, 0 V), and the second terminals t2 of the two electronic components P1 and P2 are each configured to receive an input of a signal individually from the corresponding conductor pad 16. Specifically, not only signals with different potentials (for example, +3 V, +5 V, or −3 V) but also signals with the same potential (for example, +3 V, +5 V, or −3 V) can be input to the second terminals t2 of the electronic components P1 and P2. Herein, the signals may be analog or digital.

As another structure example, as shown in FIG. 6, the first terminal t1 of the electronic component P1 is connected to the ground wiring 15 (on the left-hand side of FIG. 6) via the conductor via 15a, and the first terminal t1 of the electronic component P2 is connected to the different ground wiring 15 (on the right-hand side of FIG. 6) via the conductor via 15a. Further, the second terminal t2 of the electronic component P1 is connected to the signal wiring 14 (on the left-hand side of FIG. 6) via the conductor via 14a, and the second terminal t2 of the electronic component P2 is connected to the different signal wiring 14 (on the right-hand side of FIG. 6) via the conductor via 14a. Additionally, the signal wirings 14 are connected to a common conductor pad 16 via the conductor vias 16a.

In other words, in the structure example shown in FIG. 6, the first terminals t1 of the two electronic components P1 and P2 are each at a ground potential (for example, 0 V), and the second terminals t2 of the two electronic components P1 and P2 are each configured to receive an input of a signal from the common conductor pad 16. Specifically, signals with the same potential (for example, +3 V, +5 V, or −3 V) can be input to the second terminals t2 of the electronic components P1 and P2. Herein, the signals may be analog or digital.

According to the substrate with built-in electronic component in this embodiment, the following effects can be obtained.

(b1) One cavity 11a stores the two electronic components P1 and P2, and thus the electronic components P1 and P2 in the cavity 11a can have a high degree of freedom in arrangement (degree of freedom in position or orientation). Further, the two electronic components P1 and P2 stored in the cavity 11a are arranged such that the second terminals t2 on the signal potential side face each other in a non-contact manner. Consequently, compared with the case where the first terminal t1 on the ground potential side and the second terminal t2 on the signal potential side are arranged so as to face each other, mutual interference, such as crosstalk, between the electronic components P1 and P2 can be suppressed.

(b2) The first terminals t1 of the two electronic components P1 and P2 on the ground potential side each face the core material 11b (to the inner wall of the cavity 11a), and thus the distance CL3 between each first terminal t1 and the core material 11b can be reduced as much as possible and the length of the cavity 11a in the X-axis direction can be reduced. This allows a reduction in area of the horizontal cross-section of the cavity 11a to be achieved, resulting in a contribution to the downsizing of the substrate with built-in electronic component.

(b3) The second terminals t2 of the two electronic components P1 and P2 face each other at the distance CL4 larger than the distance CL3, or the like. This arrangement can avoid bringing the second terminals t2 of the electronic components P1 and P2 into contact with each other and with the core material 11b, if the positions of the electronic components P1 and P2 are somewhat displaced in a process of manufacturing the substrate with built-in electronic component. Consequently, an electromagnetic failure due to such a contact can be prevented, and defects or the like of the electronic components P1 and P2 can be prevented. Further, if the first terminals t1 are brought into contact with or close to the inner wall of the cavity 11a, an electromagnetic failure does not occur because the first terminals t1 are each kept at the ground potential. This also allows the defects or the like of the electronic components P1 and P2 to be prevented.

(b4) The electronic components P1 and P2 are arranged such that a direction connecting the first terminals t1 and the second terminals t2 is on an approximately straight line along the X-axis direction, and thus the length of the cavity 11a in the Y-axis direction can be reduced. This allows a further reduction in area of the horizontal cross-section of the cavity 11a to be achieved, resulting in a further contribution to the downsizing of the substrate with built-in electronic component.

(b5) The distance CL3 between the first terminal t1 and the core material 11b can be reduced in each of the two electronic components P1 and P2, and thus the distance CL4 between the second terminals t2 can be further increased. Consequently, as in the structure example shown in FIG. 5, also when signals with different potentials or with the same potential are individually input to the respective second terminals t2 of the electronic components P1 and P2, a distance between the two signal wirings 14 connected to the respective second terminals t2 can be increased as much as possible and the generation of noise interference between the two signal wirings 14 can be suppressed.

Third Embodiment

FIGS. 7 and 8

FIG. 7 is a horizontal cross-sectional view showing an arrangement of electronic components in a substrate with built-in electronic component according to a third embodiment of the present disclosure. FIG. 8 is a vertical cross-sectional view showing a structure example of the substrate with built-in electronic component that has the arrangement shown in FIG. 7. It should be noted that FIG. 7 corresponds to a cross-sectional view taken along the line C-C of FIG. 8.

As shown in FIGS. 7 and 8, the substrate with built-in electronic component in this embodiment includes a core layer 11 including a core material 11b and a cavity 11a, insulating layers 13 and 17 formed on the core layer 11, and two electronic components P1 and P2 stored in the cavity 11a.

The insulating layer 13 includes signal wirings 14 and a ground wiring 15 and is provided on the upper surface of the core layer 11. The signal wirings 14 and the ground wiring 15 are each formed in one wiring layer arranged in the insulating layer 13. Conductor pads 16 connected to the signal wirings 14 are provided on the upper surface of the insulating layer 13.

As in the insulating layer 13, the insulating layer 17 includes signal wirings 18 and a ground wiring 19 and is provided on the lower surface of the core layer 11. The signal wirings 18 and the ground wiring 19 are each formed in one wiring layer arranged in the insulating layer 17. Conductor pads 20 connected to the signal wirings 18 are provided on the lower surface of the insulating layer 17.

The insulating layers 13 and 17 each have the thickness of 30 to 90 μm, for example. Further, each of the signal wirings 14 and 18, ground wirings 15 and 19, and conductor pads 16 and 20 is made of metal such as copper and an copper alloy and has the thickness of 5 to 25 μm, for example.

The core material 11b is made of a conductor such as copper and a copper alloy and has the thickness of 100 to 400 μm, for example. The core material 11b is connected to the ground wiring 19 and is kept at a ground potential. The cavity 11a has a horizontal cross section with an approximately rectangular shape and is formed by penetrating the core material 11b in the Z-axis direction (thickness direction). The cavity 11a contains an insulating material 12 that fills a gap between the inner side surface of the core material 11b and each of the electronic components P1 and P2. The insulating material 12 and the insulating layers 13 and 17 are each made of a synthetic resin of an epoxy resin, polyimide, a bismaleimide triazine resin, a resin containing any one of them and a reinforcing filler made of a silicon dioxide, or the like (not only a thermosetting resin but also a thermoplastic resin can be used).

Each of the electronic components P1 and P2 has an approximately rectangular parallelepiped shape and is configured such that one end portion and the other end portion of the electronic component are arranged on a straight line extending along the X-axis direction in this embodiment. Each of the electronic components P1 and P2 includes a first terminal t1 and a second terminal t2. The first terminal t1 is formed at the one end portion and connected to the ground wiring 15. The second terminal t2 is formed at the other end portion and connected to the signal wiring 14. That is, the first terminal t1 is used as a terminal on a ground potential side and the second terminal t2 is used as a terminal on a signal potential side. Each of the electronic components P1 and P2 is an electronic component such as a capacitor, an inductor, a resistor, and a filter and may be a combination of the same kind of electronic components or a combination of different kinds of electronic components.

As shown in FIG. 7, the first terminal t1 has an end surface t11 and a side surface t12. The end surface t11 can be assumed to be an end surface at one end portion of each of the electronic components P1 and P2, and the side surface t12 can be assumed to be a surface that is connected to and substantially orthogonal to the end surface t11. Similarly, the second terminal t2 also has an end surface t21 and a side surface t22. The end surface t21 can be assumed to be an end surface at the other end portion of each of the electronic components P1 and P2, and the side surface t22 can be assumed to be a surface that is connected to and substantially orthogonal to the end surface t21.

As shown in FIG. 7, the two electronic components P1 and P2 are arranged such that their first terminals t1 face each other in the Y-axis direction (one axis direction) and their second terminals t2 face each other in the Y-axis direction. That is, the two electronic components P1 and P2 are arranged to face each other in the Y-axis direction (one axis direction) and are each arranged such that the first terminal t1 and the second terminal t2 are arranged on a straight line along the X-axis direction (direction orthogonal to the one axis direction). Further, the side surfaces t12 of the first terminals t1 face each other via the insulating material 12, and the end surfaces t11 of the first terminals t1 each face the core material 11b (to the inner wall of the cavity 11a) via the insulating material 12. In contrast, the side surfaces t22 of the second terminals t2 face each other via the insulating material 12, and the end surfaces t21 of the second terminals t2 each face the core material 11b (to the inner wall of the cavity 11a) at a distance CL6 larger than a distance CL5 via the insulating material 12. Furthermore, among the side surfaces t12 and t22 of the first terminals t1 and the second terminals t2, the side surfaces t12 and t22 that do not face other side surfaces t12 and t22 each face the core material 11b (to the inner wall of the cavity 11a) at a distance (not denoted by a reference symbol) larger than the distance CL5 via the insulating material 12.

In the structure example shown in FIG. 8, the first terminals t1 of the electronic components P1 and P2 on the ground potential side are connected to the common ground wiring 15 via conductor vias 15a. Further, the second terminal t2 of the electronic component P1 is connected to the signal wiring 14 via a conductor via 14a, and the second terminal t2 of the electronic component P2 is connected to the different signal wiring 14 (not shown in FIG. 8) via a conductor via 14a. Each of the signal wirings 14 is connected to a common conductor pad 16 via conductor vias 16a. In such a manner, the second terminals t2 of the electronic components P1 and P2, the side surfaces t22 of which face each other in the Y-axis direction, are connected to each other, and thus the electronic components P1 and P2 are connected parallel to each other.

In other words, in the structure example shown in FIG. 8, the first terminals t1 of the two electronic components P1 and P2 are each at a ground potential (for example, 0 V), and the second terminals t2 of the two electronic components P1 and P2 are each configured to receive an input of a signal from the common conductor pad 16. Specifically, signals with the same potential (for example, +3 V, +5 V, or −3 V) can be input to the second terminals t2 of the electronic components P1 and P2. Herein, the signals may be analog or digital.

It should be noted that as another structure example (referring to in FIG. 8), the second terminals t2 of the electronic components P1 and P2 may be connected to different conductor pads 16 and those conductor pads 16 may be connected to each other via a common wiring (not shown in the figure) or the like, and thus those second terminals t2 may be connected to each other. This also allows the signals with the same potential to be input to the respective second terminals t2 of the electronic components P1 and P2.

In such a manner, when the two electronic components P1 and P2 are connected parallel to each other and used as one functional circuit, mutual interference, such as crosstalk, between the electronic components P1 and P2 is not seen as a problem, and thus the second terminals t2 on the signal potential side may be arranged adjacently to each other. It should be noted that the phrase of being "connected parallel" refers to a case where the first terminals t1 of the plurality of electronic components are connected to each other and the second terminals t2 of the electronic components are connected to each other. Additionally, a specific connection method for the terminals is not particularly limited, and when electrical connections between the first terminals t1 and between the second terminals t2 are obtained via the conductor pads 16, other wirings, and the like, a parallel circuit can be substantially achieved.

According to the substrate with built-in electronic component in this embodiment, the following effects can be obtained.

(c1) One cavity 11a stores the two electronic components P1 and P2, and thus the electronic components P1 and P2 in the cavity 11a can have a high degree of freedom in arrangement (degree of freedom in position or orientation). Further, the two electronic components P1 and P2 are arranged such that the first terminals t1 on the ground potential side face each other in a non-contact manner and the second terminals t2 on the signal potential side face each other in a non-contact manner. Additionally, the distance CL6 between each of the second terminals t2 of the two electronic components P1 and P2 on the signal potential side and the core material 11b (to the inner wall of the cavity 11a) is large, and thus interference between the second terminal t2 and the ground (e.g., noise imparted to the ground potential of the core material 11b by the second terminal t2) can be suppressed.

(c2) The first terminals t1 of the two electronic components P1 and P2 on the ground potential side each face the core material 11b, and thus the distance CL5 between each of the first terminals t1 and the core material 11b (the inner wall of the cavity 11a) can be reduced as much as possible and the length of the cavity 11a in the X-axis direction can be reduced. This allows a reduction in area of the horizontal cross-section of the cavity 11a to be achieved, resulting in a contribution to the downsizing of the substrate with built-in electronic component.

(c3) The second terminals t2 of the two electronic components P1 and P2 on the signal potential side each face the core material 11b (to the inner wall of the cavity 11a) at the distance CL6 larger than the distance CL5, or the like. This arrangement can avoid bringing the second terminals t2 of the electronic components P1 and P2 on the signal potential side into contact with the core material 11b that is kept at a ground potential, if the positions of the electronic components P1 and P2 are somewhat displaced in a process of manufacturing the substrate with built-in electronic component. Consequently, an electromagnetic failure due to such a contact can be prevented, and defects or the like of the electronic components P1 and P2 can be prevented. Further, if the first terminals t1 are brought into contact with or close to the core material 11b (to the inner wall of the cavity 11a) that is kept at a ground potential, an electromagnetic failure does not occur because the first terminals t1 are each kept at the ground potential. This also allows the defects or the like of the electronic components P1 and P2 to be prevented.

(c4) The two electronic components P1 and P2 are arranged such that a direction connecting the first terminal t1 and the second terminal t2 of one of the two electronic components P1 and P2 is parallel to a direction connecting the first terminal t1 and the second terminal t2 of the other electronic component. Thus, the length of the cavity 11a in the Y-axis direction can be reduced. This allows a further reduction in area of the horizontal cross-section of the cavity 11a to be achieved, resulting in a further contribution to the downsizing of the substrate with built-in electronic component.

Fourth Embodiment

Figure 9:
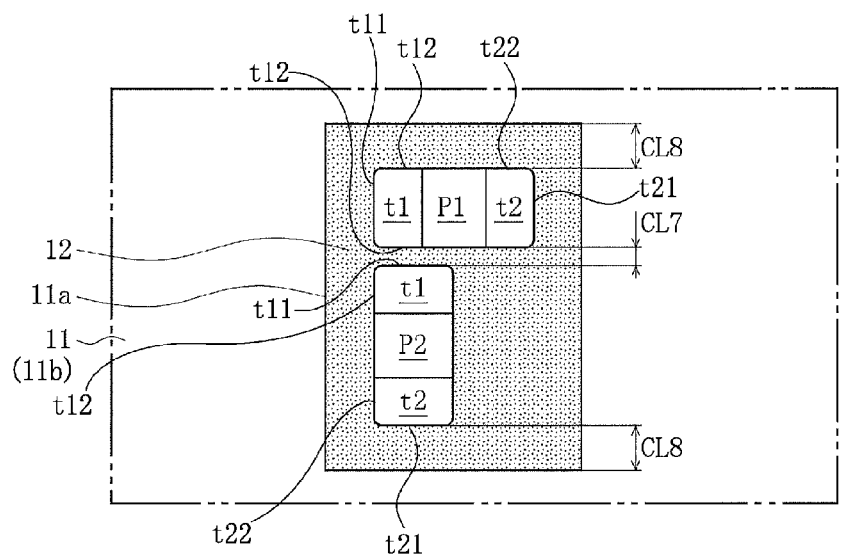
FIG. 9 is a horizontal cross-sectional view showing an arrangement of electronic components in a substrate with built-in electronic component according to a fourth embodiment of the present disclosure.
Figure 9:
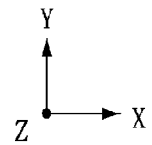
Figure 10:
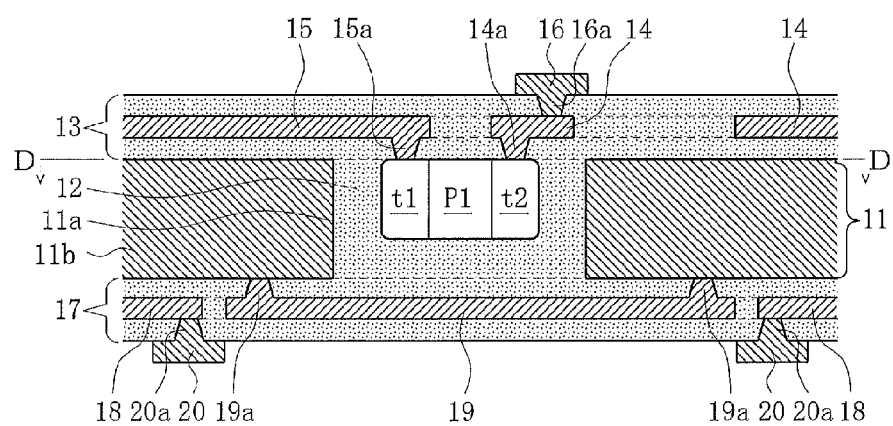
FIG. 10 is a vertical cross-sectional view showing a structure example of the substrate with built-in electronic component that has the arrangement shown in FIG. 9.
Figure 10:
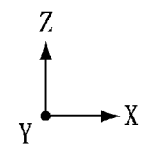

FIGS. 9 and 10

FIG. 9 is a horizontal cross-sectional view showing an arrangement of electronic components in a substrate with built-in electronic component according to a fourth embodiment of the present disclosure. FIG. 10 is a vertical cross-sectional view showing a structure example of the substrate with built-in electronic component that has the arrangement shown in FIG. 9. It should be noted that FIG. 9 corresponds to a cross-sectional view taken along the line D-D of FIG. 10.

As shown in FIGS. 9 and 10, the substrate with built-in electronic component in this embodiment includes a core layer 11 including a core material 11b and a cavity 11a, insulating layers 13 and 17 formed on the core layer 11, and two electronic components P1 and P2 stored in the cavity 11a.

The insulating layer 13 includes signal wirings 14 and a ground wiring 15 and is provided on the upper surface of the core layer 11. The signal wirings 14 and the ground wiring 15 are each formed in one wiring layer arranged in the insulating layer 13. Conductor pads 16 connected to the signal wirings 14 are provided on the upper surface of the insulating layer 13.

As in the insulating layer 13, the insulating layer 17 includes signal wirings 18 and a ground wiring 19 and is provided on the lower surface of the core layer 11. The signal wirings 18 and the ground wiring 19 are each formed in one wiring layer arranged in the insulating layer 17. Conductor pads 20 connected to the signal wirings 18 are provided on the lower surface of the insulating layer 17.

The insulating layers 13 and 17 each have the thickness of 30 to 90 µm, for example. Further, each of the signal wirings 14 and 18, ground wirings 15 and 19, and conductor pads 16 and 20 is made of metal such as copper and an copper alloy and has the thickness of 5 to 25 µm, for example.

The core material 11b is made of a conductor such as copper and a copper alloy and has the thickness of 100 to 400 µm, for example. The core material 11b is connected to the ground wiring 19 and is kept at a ground potential. The cavity 11a has a horizontal cross section with an approximately rectangular shape and is formed by penetrating the core material 11b in the Z-axis direction (thickness direction). The cavity 11a contains an insulating material 12 that fills a gap between the inner side surface of the core material 11b and each of the electronic components P1 and P2. The insulating material 12 and the insulating layers 13 and 17 are each made of a synthetic resin of an epoxy resin, polyimide, a bismaleimide triazine resin, a resin containing any one of them and a reinforcing filler made of a silicon dioxide, or the like (not only a thermosetting resin but also a thermoplastic resin can be used).

Each of the electronic components P1 and P2 has an approximately rectangular parallelepiped shape. The electronic component P1 is configured such that one end portion and the other end portion are arranged on a straight line extending along the X-axis direction, and the other electronic component P2 is configured such that one end portion and the other end portion are arranged on a straight line extending along the Y-axis direction. Each of the electronic components P1 and P2 includes a first terminal t1 and a second terminal t2. The first terminal t1 is formed at one end portion and connected to the ground wiring 15. The second terminal t2 is formed at the other end portion and connected to the signal wiring 14. Each of the electronic components P1 and P2 is an electronic component such as a capacitor, an inductor, a resistor, and a filter and may be a combination of the same kind of electronic components or a combination of different kinds of electronic components.

As shown in FIG. 9, the first terminal t1 has an end surface t11 and a side surface t12. The end surface t11 can be assumed to be an end surface at one end portion of each of the electronic components P1 and P2, and the side surface t12 can be assumed to be a surface that is connected to and substantially orthogonal to the end surface t11. Similarly, the second terminal t2 also has an end surface t21 and a side surface t22. The end surface t21 can be assumed to be an end surface at the other end portion of each of the electronic components P1 and P2, and the side surface t22 can be assumed to be a surface that is connected to and substantially orthogonal to the end surface t21.

As shown in FIG. 9, the two electronic components P1 and P2 are arranged such that their first terminals t1 face each other in the Y-axis direction and a direction connecting the first terminal t1 and the second terminal t2 of one of the electronic components P1 and P2 forms an approximately right angle with a direction connecting the first terminal t1 and the second terminal t2 of the other electronic component. That is, the electronic component P1 is arranged such that the first terminal t1 and the second terminal t2 are arranged on a straight line along the X-axis direction (one axis direction), and the electronic component P2 is arranged such that the first terminal t1 and the second terminal t2 are arranged on a straight line along the Y-axis direction (direction orthogonal to the one axis direction). Further, the side surface t12 of the first terminal t1 of the electronic component P1 faces the end surface t11 of the first terminal t1 of the electronic component P2 at a distance CL7 via the insulating material 12. The side surface t22 of the second terminal t2 of the electronic component P1 faces the core material 11b (to the inner wall of the cavity 11a) at a distance CL8 larger than the distance CL7 via the insulating material 12, and the end surface t21 of the second terminal t2 of the electronic component P2 also faces the core material 11b (to the inner wall of the cavity 11a) at the distance CL8 via the insulating material 12. Further, the end surface t21 of the second terminal t2 of the electronic component P1 and the side surface t22 of the second terminal t2 of the electronic component P2 each face the core material 11b (to the inner wall of the cavity 11a) at a distance (not denoted by a reference symbol) larger than the distance CL7 via the insulating material 12.

In the structure example shown in FIG. 10, the first terminals t1 of the electronic components P1 and P2 are connected to the common ground wiring 15 via conductor vias 15a. Further, the second terminal t2 of the electronic component P1 is connected to the signal wiring 14 via a conductor via 14a, and the second terminal t2 of the electronic component P2 is connected to the different signal wiring 14 (not shown in FIG. 10) via a conductor via 14a. Further, each of the signal wirings 14 is connected to a corresponding conductor pad 16 via a conductor via 16a.

In other words, in the structure example shown in FIG. 10, the first terminals t1 of the two electronic components P1 and P2 are each at a ground potential (for example, 0 V). In contrast, the second terminals t2 of the two electronic components P1 and P2 are each configured to receive an input of a signal individually from the corresponding conductor pad 16. Specifically, not only signals with different potentials (for example, +3 V, +5 V, or −3 V) but also signals with the same potential (for example, +3 V, +5 V, or −3 V) can be input to the second terminals t2 of the electronic components P1 and P2. Herein, the signals may be analog or digital.

As another structure example (referring to FIG. 10), the first terminals t1 of the electronic components P1 and P2 are connected to the common ground wiring 15 via the conductor vias 15a. Further, the second terminal t2 of the electronic component P1 is connected to the signal wiring 14 via the conductor via 14a, and the second terminal t2 of the electronic component P2 is connected to the different signal wiring 14 (not shown in FIG. 10) via the different conductor via 14a. Additionally, the signal wirings 14 are connected to a common conductor pad 16 via the conductor vias 16a.

In other words, in this structure example, the first terminals t1 of the two electronic components P1 and P2 stored in the cavity 11a are each at a ground potential (for example, 0 V), and the second terminals t2 of the two electronic components P1 and P2 are each configured to receive an input of a signal from the common conductor pad 16. Specifically, signals with the same potential (for example, +3 V, +5 V, or −3 V) can be input to the second terminals t2 of the electronic components P1 and P2. Herein, the signals may be analog or digital.

According to the substrate with built-in electronic component in this embodiment, the following effects can be obtained.

(d1) One cavity 11a stores the two electronic components P1 and P2, and thus the electronic components P1 and P2 in the cavity 11a can have a high degree of freedom in arrangement (degree of freedom in position or orientation). Further, the two electronic components P1 and P2 stored in one cavity 11a are arranged such that the first terminals t1 on the ground potential side face each other in a non-contact manner. Consequently, compared with the case where the first terminal t1 on the ground potential side and the second terminal t2 on the signal potential side are arranged so as to face each other, mutual interference, such as crosstalk, between the electronic components P1 and P2 can be suppressed.

(d2) The first terminals t1 of the two electronic components P1 and P2 on the ground potential side face each other, and thus the distance CL7 between the first terminals t1 can be reduced as much as possible and the length of the cavity 11a in the Y-axis direction can be reduced. This allows a reduction in area of the horizontal cross-section of the cavity 11a to be achieved, resulting in a contribution to the downsizing of the substrate with built-in electronic component.

(d3) The second terminals t2 of the two electronic components P1 and P2 on the signal potential side each face the core material 11b (to the inner wall of the cavity 11a) at the distance CL8 larger than the distance CL7, or the like. This arrangement can avoid bringing the second terminals t2 of the electronic components P1 and P2 on the signal potential side into contact with the core material 11b that is kept at a ground potential, if the positions of the electronic components P1 and P2 are somewhat displaced in a process of manufacturing the substrate with built-in electronic component. Consequently, an electromagnetic failure due to such a contact can be prevented, and defects or the like of the electronic components P1 and P2 can be prevented. Further, if the first terminals t1 that are each kept at a ground potential are brought into contact with or close to each other, an electromagnetic failure does not occur. This also allows the defects or the like of the electronic components P1 and P2 to be prevented.

(d4) The electronic components P1 and P2 are arranged such that a direction connecting the first terminal t1 and the second terminal t2 of one of the electronic components P1 and P2 forms an approximately right angle with a direction connecting the first terminal t1 and the second terminal t2 of the other electronic component. This allows the shape of the cavity 11a to be set according to the outline that surrounds both of the electronic components P1 and P2. This allows a further reduction in area of the horizontal cross-section of the cavity 11a to be achieved, resulting in a further contribution to the downsizing of the substrate with built-in electronic component.

Fifth Embodiment

Figure 11:
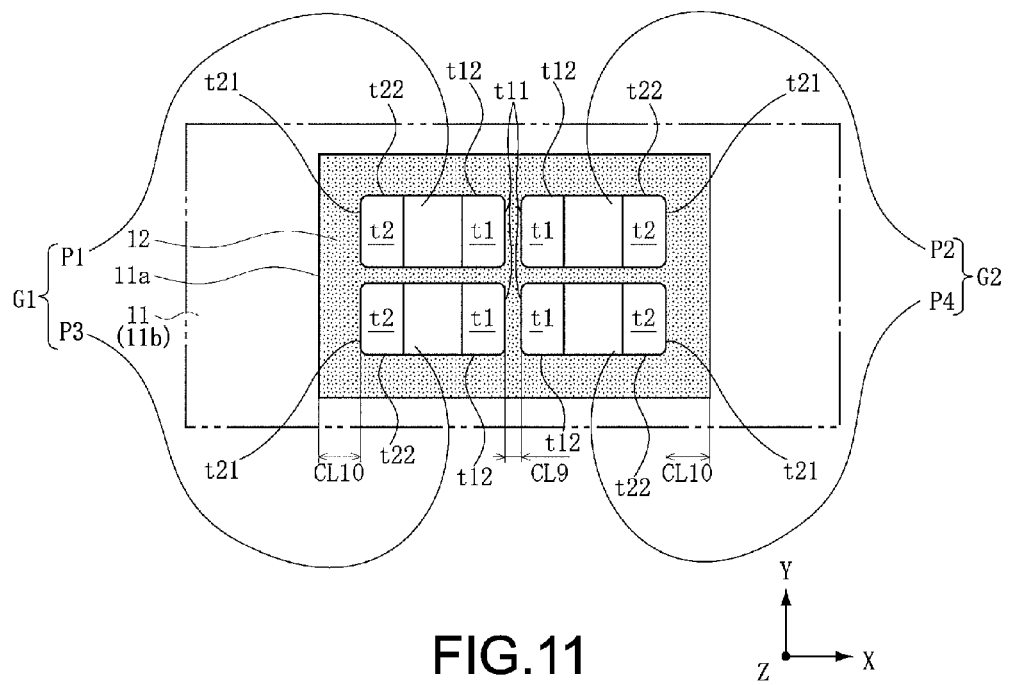
FIG. 11 is a horizontal cross-sectional view showing an arrangement of electronic components in a substrate with built-in electronic component according to a fifth embodiment of the present disclosure.
Figure 12:
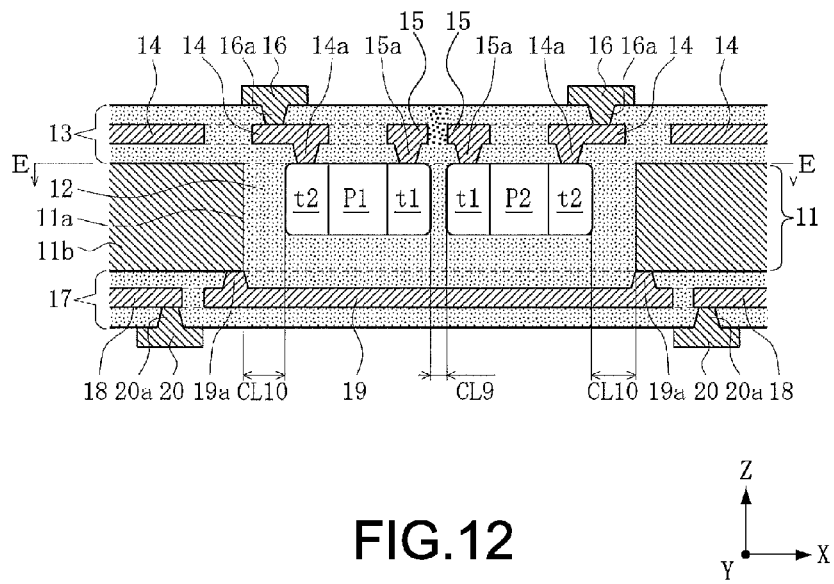
FIG. 12 is a vertical cross-sectional view showing a structure example of the substrate with built-in electronic component that has the arrangement shown in FIG. 11.
Figure 13:
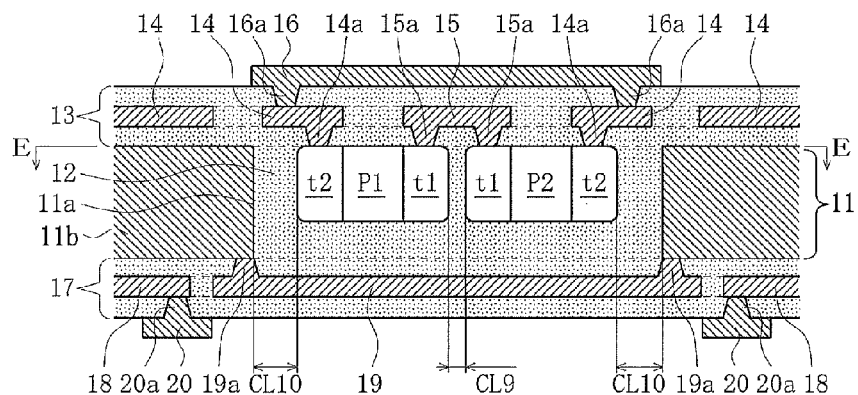
FIG. 13 is a vertical cross-sectional view showing another structure example of the substrate with built-in electronic component that has the arrangement shown in FIG. 11.

FIGS. 11 to 13

FIG. 11 is a horizontal cross-sectional view showing an arrangement of electronic components in a substrate with built-in electronic component according to a fifth embodiment of the present disclosure. FIG. 12 is a vertical cross-sectional view showing a structure example of the substrate with built-in electronic component that has the arrangement shown in FIG. 11. FIG. 13 is a vertical cross-sectional view showing another structure example of the substrate with built-in electronic component that has the arrangement shown in FIG. 11. It should be noted that FIG. 11 corresponds to a cross-sectional view taken along the line E-E of FIGS. 12 and 13.

As shown in FIGS. 11 to 13, the substrate with built-in electronic component in this embodiment includes a core layer 11 including a core material 11b and a cavity 11a, insulating layers 13 and 17 formed on the core layer 11, and four electronic components P1 to P4 stored in the cavity 11a.

The insulating layer 13 includes signal wirings 14 and ground wirings 15 and is provided on the upper surface of the core layer 11. The signal wirings 14 and the ground wirings 15 are each formed in one wiring layer arranged in the insulating layer 13. Conductor pads 16 connected to the signal wirings 14 are provided on the upper surface of the insulating layer 13.

As in the insulating layer 13, the insulating layer 17 includes signal wirings 18 and a ground wiring 19 and is provided on the lower surface of the core layer 11. The signal wirings 18 and the ground wiring 19 are each formed in one wiring layer arranged in the insulating layer 17. Conductor pads 20 connected to the signal wirings 18 are provided on the lower surface of the insulating layer 17.

The insulating layers 13 and 17 each have the thickness of 30 to 90 μm, for example. Further, each of the signal wirings 14 and 18, ground wirings 15 and 19, and conductor pads 16 and 20 is made of metal such as copper and an copper alloy and has the thickness of 5 to 25 μm, for example.

The core material 11b is made of a conductor such as copper and a copper alloy and has the thickness of 100 to 400 μm, for example. The core material 11b is connected to the ground wiring 19 and is kept at a ground potential. The cavity 11a has a horizontal cross section with an approximately rectangular shape and is formed by penetrating the core material 11b in the Z-axis direction (thickness direction). The cavity 11a contains an insulating material 12 that fills a gap between the inner side surface of the core material 11b and each of the electronic components P1 to P4. The insulating material 12 and the insulating layers 13 and 17 are each made of a synthetic resin of an epoxy resin, polyimide, a bismaleimide triazine resin, a resin containing any one of them and a reinforcing filler made of a silicon dioxide, or the like (not only a thermosetting resin but also a thermoplastic resin can be used).

Each of the electronic components P1 to P4 has an approximately rectangular parallelepiped shape and is configured such that one end portion and the other end portion of the electronic component are arranged on a straight line extending along the X-axis direction in this embodiment. Each of the electronic components P1 to P4 includes a first terminal t1 and a second terminal t2. The first terminal t1 is formed at the one end portion and connected to the ground wiring 15. The second terminal t2 is formed at the other end portion and connected to the signal wiring 14. That is, the first terminal t1 is used as a terminal on a ground potential side and the second terminal t2 is used as a terminal on a signal potential side. Each of the electronic components P1 to P4 is an electronic component such as a capacitor, an inductor, a resistor, and a filter and may be a combination of the same kind of electronic components or a combination of different kinds of electronic components.

As shown in FIG. 11, the first terminal t1 has an end surface t11 and a side surface t12. The end surface t11 can be assumed to be an end surface at one end portion of each of the electronic components P1 to P4, and the side surface t12 can be assumed to be a surface that is connected to and substantially orthogonal to the end surface t11. Similarly, the second terminal t2 also has an end surface t21 and a side surface t22. The end surface t21 can be assumed to be an end surface at the other end portion of each of the electronic components P1 to P4, and the side surface t22 can be assumed to be a surface that is connected to and substantially orthogonal to the end surface t21.

As shown in FIG. 11, the four electronic components P1 to P4 are arranged such that the first terminals t1 of the electronic components P1 and P2 face each other and the first terminals t1 of the electronic components P3 and P4 face each other in the X-axis direction (one axis direction), and the first terminal t1 and the second terminal t2 of each of the four electronic components P1 to P4 are arranged on a straight line along the X-axis direction. Further, in this embodiment, the four electronic components P1 to P4 include a set G1 including the electronic components P1 and P3 and a set G2 including the electronic components P2 and P4. The second terminals t2 of the electronic components P1 and P3 in the set G1 are connected to each other. The second terminals t2 of the electronic components P2 and P4 in the set G2 are connected to each other. In the electronic components P1 and P3 of the set G1, the side surfaces t12 of the first terminals t1 face each other via the insulating material 12, and the side surfaces t22 of the second terminals t2 face each other via the insulating material 12. Similarly, in the electronic components P2 and P4 of the set G2, the side surfaces t12 of the first terminals t1 face each other via the insulating material 12, and the side surfaces t22 of the second terminals t2 face each other via the insulating material 12.

In the two sets G1 and G2, the end surfaces t11 of the first terminals t1 of the electronic components P1 and P3 included in the set G1 face the end surfaces t11 of the first terminals t1 of the electronic components P2 and P4 included in the set G2 in the X-axis direction. That is, the end surface t11 of the first terminal t1 of the electronic component P1 and the end surface t11 of the first terminal t1 of the electronic component P2 face each other at a distance CL9, and the end surface t11 of the first terminal t1 of the electronic component P3 and the end surface t11 of the first terminal t1 of the electronic component P4 face each other at the distance CL9. Further, the end surfaces t21 of the second terminals t2 are each arranged to face the core material 11b (to the inner wall of the cavity 11a) at a distance CL10 larger than the distance CL9 via the insulating material 12. Furthermore, among the side surfaces t12 and t22 of the first terminals t1 and the second terminals t2, the side surfaces t12 and t22 that do not face other side surfaces t12 and t22 each face the core material 11b (to the inner wall of the cavity 11a) at a distance (not denoted by a reference symbol) larger than the distance CL9 via the insulating material 12.

In the structure example shown in FIG. 12, the first terminals t1 of the electronic components P1 and P3 are connected to the common ground wiring 15 (on the left-hand side of FIG. 12) via conductor vias 15a, and the first terminals t1 of the electronic components P2 and P4 are connected to the different common ground wiring 15 (on the right-hand side of FIG. 12) via conductor vias 15a. Further, the second terminal t2 of the electronic component P1 is connected to the signal wiring 14 (on the left-hand side of FIG. 12) via a conductor via 14a, the second terminal t2 of the electronic component P2 is connected to the different signal wiring 14 (on the right-hand side of FIG. 12) via a conductor via 14a, the second terminal t2 of the electronic component P3 is connected to another signal wiring 14 (not shown in FIG. 12) via a conductor via 14a, and the second terminal t2 of the electronic component P4 is connected to another signal wiring 14 (not shown in FIG. 12) via a conductor via 14a. Furthermore, the signal wiring 14 of the electronic component P1 and the signal wiring 14 of the electronic component P3 are connected to a common conductor pad 16 via corresponding conductor vias 16*a*. In contrast, the signal wiring 14 of the electronic component P2 and the signal wiring 14 of the electronic component P4 are connected to a common conductor pad 16 via corresponding conductor vias 16*a*.

In such a manner, the second terminals t2 of the electronic components P1 and P3, the side surfaces t22 of which face each other in the Y-axis direction, are connected to each other and the second terminals t2 of the electronic components P2 and P4, the side surfaces t22 of which face each other in the Y-axis direction, are connected to each other. Consequently, in this structure example, the electronic components P1 and P3 are connected parallel to each other and the electronic components P2 and P4 are connected parallel to each other.

In other words, in the structure example shown in FIG. 12, the first terminals t1 of the four electronic components P1 to P4 stored in the cavity 11*a* are each at a ground potential (for example, 0 V). In contrast, the second terminals t2 of the electronic components P1 and P3 facing each other in the Y-axis direction are each configured to receive an input of a signal from the common conductor pad 16. Similarly, the second terminals t2 of the electronic components P2 and P4 facing each other in the Y-axis direction are each also configured to receive an input of a signal from the common conductor pad 16. Specifically, signals with the same potential (for example, +3 V, +5 V, or −3 V) can be input to the second terminals t2 of the electronic components P1 and P3, and signals with the same potential can be input to the second terminals t2 of the electronic components P2 and P4. Herein, the signals may be analog or digital.

As another structure example, as shown in FIG. 13, the first terminals t1 of the electronic components P1 to P4 on the ground potential side are connected to the common ground wiring 15 via the conductor vias 15*a*. Further, the second terminal t2 of the electronic component P1 is connected to the signal wiring 14 (on the left-hand side of FIG. 13) via the conductor via 14*a*, the second terminal t2 of the electronic component P2 is connected to the different signal wiring 14 (on the right-hand side of FIG. 13) via the conductor via 14*a*, the second terminal t2 of the electronic component P3 is connected to another signal wiring 14 (not shown in FIG. 13) via the conductor via 14*a*, and the second terminal t2 of the electronic component P4 is connected to another signal wiring 14 (not shown in FIG. 13) via the conductor via 14*a*. Additionally, the signal wirings 14 are connected to a common conductor pad 16 via the conductor vias 16*a*.

In such a manner, in the structure example shown in FIG. 13, the second terminals t2 of the electronic components P1 to P4 are connected to each other, the electronic components P1 to P4 including the electronic components P1 and P3 in which the side surfaces t22 face each other in the Y-axis direction and the electronic components P2 and P4 in which the side surfaces t22 face each other in the Y-axis direction. Consequently, in this structure example, the four electronic components P1 to P4 are connected parallel to each other.

In other words, in the structure example shown in FIG. 13, the first terminals t1 of the four electronic components P1 to P4 are each at a ground potential (for example, 0 V), and the second terminals t2 of the four electronic components P1 to P4 are each configured to receive an input of a signal from the common conductor pad 16. Specifically, signals with the same potential (for example, +3 V, +5 V, or −3 V) can be input to the second terminals t2 of the respective electronic components P1 to P4. Herein, the signals may be analog or digital.

It should be noted that as another structure example (referring to FIG. 12), the second terminals t2 of the four electronic components P1 to P4 may be connected to different conductor pads 16. In this case, the conductor pads 16 of the electronic components P1 and P3 may be connected to each other via a common wiring or the like and the conductor pads 16 of the electronic components P2 and P4 may be connected to each other via another common wiring or the like, and thus those second terminals t2 in each set of the electronic components can be connected to each other. This also allows the signals with the same potential to be input to the second terminals t2 of the electronic components P1 and P3 and to the second terminals t2 of the electronic components P2 and P4, as in the structure example shown in FIG. 12. Alternatively, in the case where the second terminals t2 of the four electronic components P1 to P4 are connected to different conductor pads 16, the conductor pads 16 of the electronic components P1 to P4 may be connected to one another via a common wiring or the like (not shown in the figure), and thus those second terminals t2 may be connected to one another. This also allows the signals with the same potential to be input to the second terminals t2 of the electronic components P1 to P4 as in the structure example shown in FIG. 13.

In such a manner, in this embodiment, the electronic components included in each of the sets G1 and G2 are connected parallel to each other and used as a functional circuit. Consequently, in each of the sets G1 and G2, mutual interference such as crosstalk is not seen as a problem, and thus the second terminals t2 on the signal potential side may be arranged adjacently to each other. In contrast, mutual interference such as crosstalk may be problematic between the two sets G1 and G2 and between each of the electronic components P1 and P4 and the core material 11*b*. In this regard, in this embodiment, such mutual interference is intended to be suppressed by the arrangement of the electronic components P1 to P4 as described above.

According to the substrate with built-in electronic component in this embodiment, the following effects can be obtained.

(e1) One cavity 11*a* stores the four electronic components P1 to P4, and thus the electronic components P1 to P4 in the cavity 11*a* can have a high degree of freedom in arrangement (degree of freedom in position or orientation). Further, the four electronic components P1 to P4 stored in the cavity 11*a* are arranged such that the first terminals t1 on the ground potential side face each other in a non-contact manner. Consequently, compared with the case where the first terminal t1 on the ground potential side and the second terminal t2 on the signal potential side are arranged so as to face each other, mutual interference, such as crosstalk, between the two sets G1 and G2 can be suppressed.

(e2) The first terminals t1 of the electronic components P1 and P2 on the ground potential side face each other and the first terminals t1 of the electronic components P3 and P4 on the ground potential side face each other, and thus the distance CL9 between the first terminals t1 can be reduced as much as possible and the length of the cavity 11*a* in the X-axis direction can be reduced. This allows a reduction in area of the horizontal cross-section of the cavity 11*a* to be achieved, resulting in a contribution to the downsizing of the substrate with built-in electronic component.

(e3) The second terminals t2 of the four electronic components P1 to P4 on the signal potential side each face the core material 11*b* (to the inner wall of the cavity 11*a*) at the distance CL10 larger than the distance CL9, or the like. This arrangement can avoid bringing the second terminals t2 of the electronic components P1 to P4 into contact with the core material 11*b* that is kept at a ground potential, if the positions of the electronic components P1 to P4 are somewhat displaced in a process of manufacturing the substrate with built-in electronic component. Consequently, an electromagnetic failure due to such a contact can be prevented, and defects or the like of the electronic components P1 to P4 can be prevented. Further, if the first terminals t1 that are each kept at a ground potential are brought into contact with or close to each other, an electromagnetic failure does not occur. This also allows the defects or the like of the electronic components P1 to P4 to be prevented.

(e4) The four electronic components P1 to P4 are arranged such that a direction connecting the first terminals t1 and the second terminals t2 of the two electronic components P1 and P2 is on an approximately straight line and a direction connecting the first terminals t1 and the second terminals t2 of the other two electronic components P3 and P4 is on an approximately straight line and such that those directions are parallel to each other. Thus, the length of the cavity 11a in the Y-axis direction can be reduced. This allows a further reduction in area of the horizontal cross-section of the cavity 11a to be achieved, resulting in a further contribution to the downsizing of the substrate with built-in electronic component.

(e5) The structure example shown in FIG. 12 has a wiring structure in which the ground wirings 15 are interposed between the four signal wirings 14 connected to the second terminals t2 of the electronic components P1 to P4. Consequently, also when signals with different potentials or with the same potential are individually input to the respective second terminals t2 of the electronic components P1 to P4, the generation of noise interference between the four signal wirings 14 can be suppressed.

Sixth Embodiment

Figure 14:
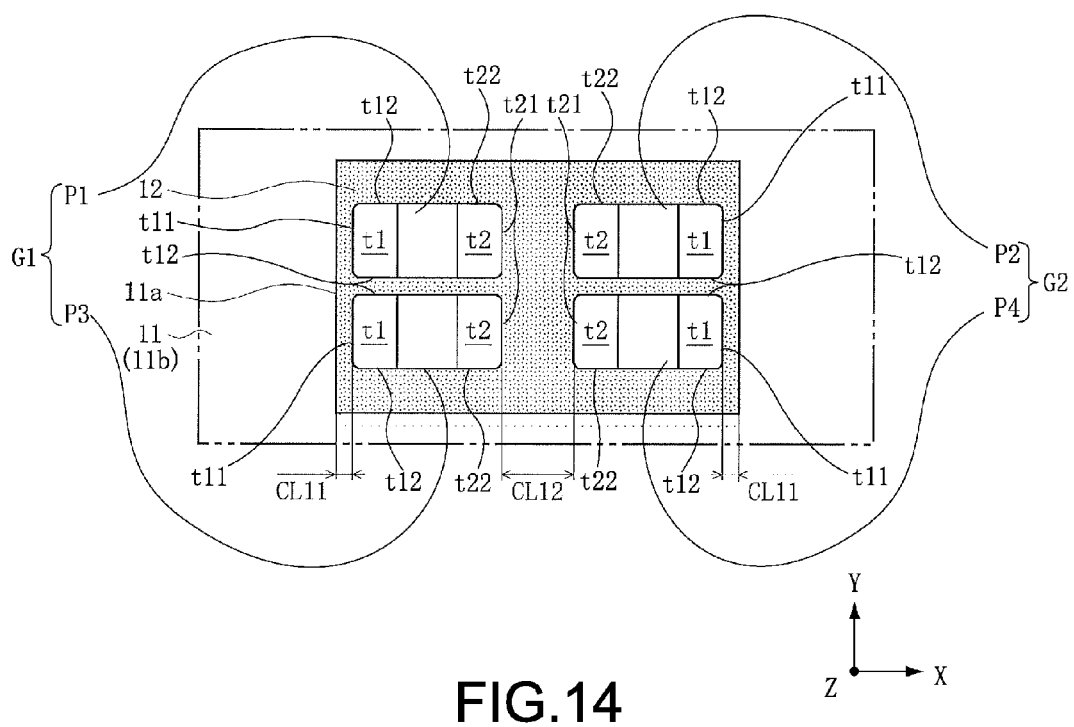
FIG. 14 is a horizontal cross-sectional view showing an arrangement of electronic components in a substrate with built-in electronic component according to a sixth embodiment of the present disclosure.
Figure 15:
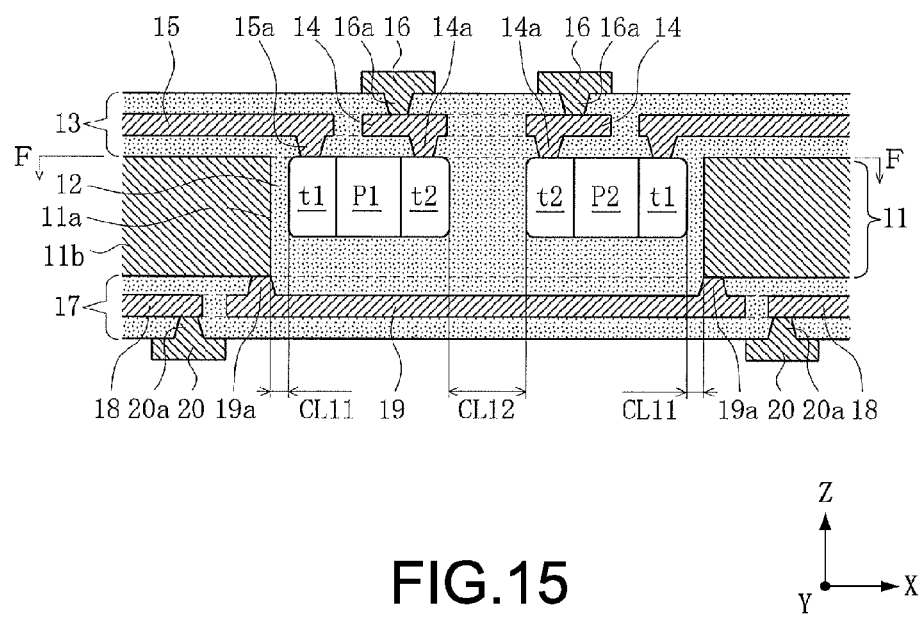
FIG. 15 is a vertical cross-sectional view showing a structure example of the substrate with built-in electronic component that has the arrangement shown in FIG. 14.

FIGS. 14 and 15

FIG. 14 is a horizontal cross-sectional view showing an arrangement of electronic components in a substrate with built-in electronic component according to a sixth embodiment of the present disclosure. FIG. 15 is a vertical cross-sectional view showing a structure example of the substrate with built-in electronic component that has the arrangement shown in FIG. 14. It should be noted that FIG. 14 corresponds to a cross-sectional view taken along the line F-F of FIG. 15.

As shown in FIGS. 14 and 15, the substrate with built-in electronic component in this embodiment includes a core layer 11 including a core material 11b and a cavity 11a, insulating layers 13 and 17 formed on the core layer 11, and four electronic components P1 to P4 stored in the cavity 11a.

The insulating layer 13 includes signal wirings 14 and ground wirings 15 and is provided on the upper surface of the core layer 11. The signal wirings 14 and the ground wirings 15 are each formed in one wiring layer arranged in the insulating layer 13. Conductor pads 16 connected to the signal wirings 14 are provided on the upper surface of the insulating layer 13.

As in the insulating layer 13, the insulating layer 17 includes signal wirings 18 and a ground wiring 19 and is provided on the lower surface of the core layer 11. The signal wirings 18 and the ground wiring 19 are each formed in one wiring layer arranged in the insulating layer 17. Conductor pads 20 connected to the signal wirings 18 are provided on the lower surface of the insulating layer 17.

The insulating layers 13 and 17 each have the thickness of 30 to 90 µm, for example. Further, each of the signal wirings 14 and 18, ground wirings 15 and 19, and conductor pads 16 and 20 is made of metal such as copper and an copper alloy and has the thickness of 5 to 25 µm, for example.

The core material 11b is made of a conductor such as copper and a copper alloy and has the thickness of 100 to 400 µm, for example. The core material 11b is connected to the ground wiring 19 and is kept at a ground potential. The cavity 11a has a horizontal cross section with an approximately rectangular shape and is formed by penetrating the core material 11b in the Z-axis direction (thickness direction). The cavity 11a contains an insulating material 12 that fills a gap between the inner side surface of the core material 11b and each of the electronic components P1 to P4. The insulating material 12 and the insulating layers 13 and 17 are each made of a synthetic resin of an epoxy resin, polyimide, a bismaleimide triazine resin, a resin containing any one of them and a reinforcing filler made of a silicon dioxide, or the like (not only a thermosetting resin but also a thermoplastic resin can be used).

Each of the electronic components P1 to P4 has an approximately rectangular parallelepiped shape and is configured such that one end portion and the other end portion of the electronic component are arranged on a straight line extending along the X-axis direction in this embodiment. Each of the electronic components P1 to P4 includes a first terminal t1 and a second terminal t2. The first terminal t1 is formed at the one end portion and connected to the ground wiring 15. The second terminal t2 is formed at the other end portion and connected to the signal wiring 14. That is, the first terminal t1 is used as a terminal on a ground potential side and the second terminal t2 is used as a terminal on a signal potential side. Each of the electronic components P1 to P4 is an electronic component such as a capacitor, an inductor, a resistor, and a filter and may be a combination of the same kind of electronic components or a combination of different kinds of electronic components.

As shown in FIG. 14, the first terminal t1 has an end surface t11 and a side surface t12. The end surface t11 can be assumed to be an end surface at one end portion of each of the electronic components P1 to P4, and the side surface t12 can be assumed to be a surface that is connected to and substantially orthogonal to the end surface t11. Similarly, the second terminal t2 also has an end surface t21 and a side surface t22. The end surface t21 can be assumed to be an end surface at the other end portion of each of the electronic components P1 to P4, and the side surface t22 can be assumed to be a surface that is connected to and substantially orthogonal to the end surface t21.

As shown in FIG. 14, the four electronic components P1 to P4 are arranged such that the second terminals t2 of the electronic components P1 and P2 face each other and the second terminals t2 of the electronic components P3 and P4 face each other in the X-axis direction (one axis direction), and the first terminal t1 and the second terminal t2 of each of the four electronic components P1 to P4 are arranged on a straight line along the X-axis direction. Further, in this embodiment, the four electronic components P1 to P4 include a set G1 including the electronic components P1 and P3 and a set G2 including the electronic components P2 and P4. The second terminals t2 of the electronic components P1 and P3 in the set G1 are connected to each other. The second terminals t2 of the electronic components P2 and P4 in the set G2 are connected to each other. In the electronic components P1 and P3 of the set G1, the side surfaces t12 of the first terminals t1 face each other via the insulating material 12, and the side surfaces t22 of the second terminals t2 face each other via the insulating material 12. Similarly, in the electronic components P2 and P4 of the set G2, the side surfaces t12 of the first terminals t1 face each other via the insulating material 12, and the side surfaces t22 of the second terminals t2 face each other via the insulating material 12.

In the two sets G1 and G2, the end surfaces t21 of the second terminals t2 of the electronic components P1 and P3 included in the set G1 face the end surfaces t21 of the second terminals t2 of the electronic components P2 and P4 included in the set G2 in the X-axis direction. That is, the end surface t21 of the second terminal t2 of the electronic component P1 and the end surface t21 of the second terminal t2 of the electronic component P2 face each other at a distance CL12, and the end surface t21 of the second terminal t2 of the electronic component P3 and the end surface t21 of the second terminal t2 of the electronic component P4 face each other at the distance CL12. Further, the end surfaces t11 of the first terminals t1 are each arranged to face the core material 11b (to the inner wall of the cavity 11a) at a distance CL11 smaller than the distance CL12 via the insulating material 12. Furthermore, among the side surfaces t12 and t22 of the first terminals t1 and the second terminals t2, the side surfaces t12 and t22 that do not face other side surfaces t12 and t22 each face the core material 11b (to the inner wall of the cavity 11a) at a distance (not denoted by a reference symbol) larger than the distance CL11 via the insulating material 12.

In the structure example shown in FIG. 15, the first terminals t1 of the two electronic components P1 and P3 are connected to the ground wiring 15 (on the left-hand side of FIG. 15) via conductor vias 15a, and the first terminals t1 of the other two electronic components P2 and P4 are connected to the ground wiring 15 (on the right-hand side of FIG. 15) via conductor vias 15a. Further, the second terminal t2 of the electronic component P1 is connected to the signal wiring 14 (on the left-hand side of FIG. 15) via a conductor via 14a, the second terminal t2 of the electronic component P2 is connected to the different signal wiring 14 (on the right-hand side of FIG. 15) via a conductor via 14a, the second terminal t2 of the electronic component P3 is connected to another signal wiring 14 (not shown in FIG. 15) via a conductor via 14a, and the second terminal t2 of the electronic component P4 is connected to another signal wiring 14 (not shown in FIG. 15) via a conductor via 14a. Furthermore, the signal wiring 14 of the electronic component P1 and the signal wiring 14 of the electronic component P3 are connected to a common conductor pad 16 via corresponding conductor vias 16a. In contrast, the signal wiring 14 of the electronic component P2 and the signal wiring 14 of the electronic component P4 are connected to a common conductor pad 16 via corresponding conductor vias 16a.

In such a manner, the second terminals t2 of the electronic components P1 and P3, the side surfaces t22 of which face each other in the Y-axis direction, are connected to each other and the second terminals t2 of the electronic components P2 and P4, the side surfaces t22 of which face each other in the Y-axis direction, are connected to each other. Consequently, in this structure example, the electronic components P1 and P3 are connected parallel to each other and the electronic components P2 and P4 are connected parallel to each other.

In other words, in the structure example shown in FIG. 15, the first terminals t1 of the four electronic components P1 to P4 are each at a ground potential (for example, 0 V). In contrast, the second terminals t2 of the electronic components P1 and P3 facing each other in the Y-axis direction are each configured to receive an input of a signal from the common conductor pad 16. Similarly, the second terminals t2 of the electronic components P2 and P4 facing each other in the Y-axis direction are each configured to receive an input of a signal from the common conductor pad 16. Specifically, signals with the same potential (for example, +3 V, +5 V, or −3 V) can be input to the second terminals t2 of the electronic components P1 and P3, and signals with the same potential can be input to the second terminals t2 of the electronic components P2 and P4. Herein, the signals may be analog or digital.

In such a manner, in this embodiment, the electronic components included in each of the sets G1 and G2 are connected parallel to each other and used as a functional circuit. Consequently, in each of the sets G1 and G2, mutual interference such as crosstalk is not seen as a problem, and thus the second terminals t2 on the signal potential side may be arranged adjacently to each other. In contrast, mutual interference such as crosstalk may be problematic between the two sets G1 and G2 and between each of the electronic components P1 to P4 and the core material 11b. In this regard, in this embodiment, such mutual interference is intended to be suppressed by the arrangement of the electronic components P1 to P4 as described above.

According to the substrate with built-in electronic component in this embodiment, the following effects can be obtained.

(f1) One cavity 11a stores the four electronic components P1 to P4, and thus each of the electronic components P1 to P4 in the cavity 11a can have a high degree of freedom in arrangement (degree of freedom in position or orientation). Further, the four electronic components P1 to P4 stored in the cavity 11a are arranged such that the second terminals t2 on the signal potential side face each other in a non-contact manner. Consequently, compared with the case where the first terminal t1 on the ground potential side and the second terminal t2 on the signal potential side are arranged so as to face each other, mutual interference, such as crosstalk, between the two sets G1 and G2 stored in the cavity 11a can be suppressed.

(f2) The first terminals t1 of the four electronic components P1 to P4 on the ground potential side each face the core material 11b, and thus the distance CL11 between each of the first terminals t1 and the core layer 11 (the inner wall of the cavity 11a) can be reduced as much as possible and the length of the cavity 11a in the X-axis direction can be reduced. This allows a reduction in area of the horizontal cross-section of the cavity 11a to be achieved, resulting in a contribution to the downsizing of the substrate with built-in electronic component.

(f3) The second terminals t2 of the four electronic components P1 to P4 on the signal potential side face each other at the distance CL12 larger than the distance CL11 and each face the core material 11b at a distance larger than the distance CL11. This arrangement can avoid bringing the second terminals t2 of the electronic components P1 to P4 into contact with each other and with the core material 11b that is kept at a ground potential, if the positions of the electronic components P1 to P4 are somewhat displaced in a process of manufacturing the substrate with built-in electronic component. Consequently, an electromagnetic failure due to such a contact can be prevented, and defects or the like of the electronic components P1 to P4 can be prevented. Further, if the first terminals t1 are brought into contact with or close to the core material 11b (the inner wall of the cavity 11a) that is also kept at a ground potential, an electromagnetic failure does not occur because the first terminals t1 are each kept at a ground potential. This also allows the defects or the like of the electronic components P1 to P4 to be prevented.

(f4) The four electronic components P1 to P4 are arranged such that a direction connecting the first terminals t1 and the second terminals t2 of the two electronic components P1 and P2 is on an approximately straight line and a direction connecting the first terminals t1 and the second terminals t2 of the other two electronic components P3 and P4 is on an approximately straight line and such that those directions are parallel to each other. Thus, the length of the cavity 11a in the Y-axis direction can be reduced. This allows a further reduction in area of the horizontal cross-section of the cavity 11a to be achieved, resulting in a further contribution to the downsizing of the substrate with built-in electronic component.

(f5) The distance CL11 between the first terminal t1 and the core material 11b can be reduced in each of the four electronic components P1 to P4, and thus the distance CL12 between the second terminals t2 can be further increased. Consequently, in the structure example shown in FIG. 14, also when signals with different potentials or with the same potential are individually input to the respective second terminals t2 of the electronic components P1 to P4, a distance between the four signal wirings 14 connected to the respective second terminals t2 of the electronic components P1 to P4 can be increased as much as possible and the generation of noise interference between the four signal wirings 14 can be suppressed.

Other Embodiments

No Figure (1) The first to sixth embodiments each describe the cavity 11a that is formed by penetrating the core material 11b in the Z-axis direction (thickness direction). Also in the case where the cavity 11a is formed of a concave portion that does not penetrate the core material 11b in the Z-axis direction (thickness direction), the same effects as the above-mentioned effects a1 to a5, b1 to b5, c1 to c4, d1 to d4, e1 to e5, and f1 to f5 can be produced.

(2) The first to sixth embodiments each describe the substrate in which the signal wiring 14 and the ground wiring 15 are provided in one wiring layer arranged in the insulating layer 13 located on the upper surface of the core layer 11 and the signal wiring 20 and the ground wiring 19 are provided in one wiring layer arranged in the insulating layer 17 located on the lower surface of the core layer 11. Also in the cases where a different signal wiring and a different ground wiring are provided in the insulating layer 13 separately from the signal wiring 14 and the ground wiring 15, where a different signal wiring and a different ground wiring are provided in the insulating layer 17 separately from the signal wiring 20 and the ground wiring 19, and where the signal wiring 20 and the ground wiring 19 are eliminated from the insulating layer 17 on the lower surface of the core layer 11, the same effects as the above-mentioned effects a1 to a5, b1 to b5, c1 to c4, d1 to d4, e1 to e5, and f1 to f5 can be produced.

(3) The first to sixth embodiments each describe the core material 11b that is made of metal such as copper and a copper alloy and connected to the ground wiring 19, but the core material 11b may be a conductor made of a material other than the metal described above. Further, also in the case where the core material 11b is made of a material other than the metal, for example, made of ceramics or a synthetic resin, the same effects as the above-mentioned effects a1 and a2, b1 and b2, c1 and c2, d1 and d2, e1 and e2, and f1 and f2 can be produced.

(4) Also in the case where one electronic component faces another electronic component in a direction that is orthogonal to a direction connecting the first terminal t1 and the second terminal t2 of the other electronic component (see FIGS. 7 and 11), the present disclosure is not limited to the structures in which the side surfaces t12 of the first terminals t1 face each other and the side surfaces t22 of the second terminals t2 face each other. For example, those electronic components may be arranged so as to be displaced in a direction connecting the first terminal t1 and the second terminal t2 (in the X-axis direction). Alternatively, two electronic components may have different sizes and the first terminals t1 or the second terminals t2 may face each other.

What is claimed is:

1. A substrate with built-in electronic component, comprising:
    a conductive core layer that includes a cavity containing an insulating material;
    an insulating layer that includes a ground wiring and a signal wiring and is formed on the core layer; and
    a plurality of electronic components that each include a first terminal and a second terminal and are stored in the cavity, the plurality of electronic components each having one end portion and the other end portion, the first terminal being formed at the one end portion and connected to the ground wiring, the second terminal being formed at the other end portion and connected to the signal wiring, the plurality of electronic components having at least one of arrangements in which the first terminals face each other and in which the second terminals face each other.

2. The substrate with built-in electronic component according to claim 1, wherein
    the plurality of electronic components are arranged such that the second terminals face each other via the insulating material and each of the first terminals and the core material face each other via the insulating material.

3. The substrate with built-in electronic component according to claim 2, wherein
    the core layer comprises forming the cavity in a core material made of a conductor, the core material being kept at a ground potential, and
    the second terminals face each other at a distance larger than that between each of the first terminals and the core material.

4. The substrate with built-in electronic component according to claim 2, wherein
    two of the plurality of electronic components are arranged to face each other in one axis direction, and
    each of the two electronic components are arranged such that the first terminal and the second terminal are arranged on a straight line along the axis direction.

5. The substrate with built-in electronic component according to claim 3, wherein
    two of the plurality of electronic components are arranged to face each other in one axis direction, and
    each of the two electronic components are arranged such that the first terminal and the second terminal are arranged on a straight line along the axis direction.

6. The substrate with built-in electronic component according to claim 1, wherein
    two of the plurality of electronic components are arranged to face each other in one axis direction, and
    each of the two electronic components are arranged such that the first terminal and the second terminal are arranged on a straight line along the axis direction.

* * * * *